US012724095B2

(12) United States Patent
Punzo

(10) Patent No.: US 12,724,095 B2
(45) Date of Patent: Sep. 1, 2026

(54) METHOD FOR CORRECTING INHOMOGENEITY OF THE STATIC MAGNETIC FIELD PARTICULARLY OF THE STATIC MAGNETIC FIELD GENERATED BY THE MAGNETIC STRUCTURE OF A MACHINE FOR ACQUIRING NUCLEAR MAGNETIC RESONANCE IMAGES AND MRI SYSTEM FOR CARRYING OUT SUCH METHOD

(71) Applicant: Esaote S.p.A., Genoa (IT)

(72) Inventor: Vincenzo Punzo, Genoa (IT)

(73) Assignee: ESAOTE S.p.A., Genoa (IT)

( * ) Notice: Subject to any disclaimer, the term of this patent is extended or adjusted under 35 U.S.C. 154(b) by 276 days.

(21) Appl. No.: 17/941,629

(22) Filed: Sep. 9, 2022

(65) Prior Publication Data

US 2023/0085309 A1 Mar. 16, 2023

(30) Foreign Application Priority Data

Sep. 10, 2021 (EP) .................................... 21195929

(51) Int. Cl.
*G01R 33/3873* (2006.01)
*G01R 33/383* (2006.01)

(52) U.S. Cl.
CPC ....... *G01R 33/3873* (2013.01); *G01R 33/383* (2013.01)

(58) Field of Classification Search
CPC .......................... G01R 33/383; G01R 33/3873
See application file for complete search history.

(56) References Cited

U.S. PATENT DOCUMENTS

| | | | | |
|---|---|---|---|---|
| 4,771,244 A * | 9/1988 | Vermilyea | G01R 33/3873 | 324/320 |
| 5,313,164 A * | 5/1994 | Starewicz | G01R 33/28 | 324/318 |

(Continued)

FOREIGN PATENT DOCUMENTS

| | | |
|---|---|---|
| EP | 0940686 A1 | 9/1999 |
| EP | 1748300 A1 | 1/2007 |

OTHER PUBLICATIONS

Ren et al., "Study on Shimming Method for Open Permanent Magnet of MRI", Progress in Electromagnetics Research M, vol. 6, Jan. 1, 2009 (Jan. 1, 2009), pp. 23-34, XI'055889911.

(Continued)

*Primary Examiner* — Steven L Yeninas
(74) *Attorney, Agent, or Firm* — BUCHANAN INGERSOLL & ROONEY PC

(57) ABSTRACT

Method for shimming a magnetic field which is generated by a magnetic structure, and which permeates a volume of space uses the following steps: measuring the magnetic field in a region of a volume of space permeated by the said magnetic field; determining a parameter which is a measure of the homogeneity of the magnetic field; defining a distribution of correction elements including a predetermined number of magnetic dipoles each having a predetermined magnetic charge and a predetermined position relatively to the magnetic structure generating the magnetic field; calculating the charges of each of the dipoles and the position of each of the dipoles of a distribution which minimizes the parameter being a measure of the homogeneity of the magnetic field; using the distribution of dipoles as the shimming distribution of dipoles to be positioned on the magnetic structure.

17 Claims, 15 Drawing Sheets

(56) References Cited

U.S. PATENT DOCUMENTS

| | | | | |
|---|---|---|---|---|
| 5,532,597 | A * | 7/1996 | McGinley | G01R 33/3873 324/319 |
| 6,566,991 | B1 * | 5/2003 | Rimkunas | G01R 33/3873 335/301 |
| 6,634,088 | B1 * | 10/2003 | Morrone | G01R 33/3873 324/318 |
| 2004/0036472 | A1 | 2/2004 | Goto | |
| 2007/0035298 | A1 * | 2/2007 | Pittaluga | G01R 33/387 324/309 |
| 2007/0229077 | A1 | 10/2007 | Punzo et al. | |
| 2014/0028311 | A1 | 1/2014 | Punzo | |
| 2017/0299674 | A1 * | 10/2017 | McDowell | G01R 33/3802 |
| 2018/0313920 | A1 * | 11/2018 | Sotgiu | G01R 33/383 |
| 2020/0132791 | A1 * | 4/2020 | Punzo | G01R 33/385 |
| 2021/0170595 | A1 * | 6/2021 | Hu | G01R 33/383 |
| 2023/0194636 | A1 * | 6/2023 | Shpigelmacher | H01F 7/02 324/319 |

OTHER PUBLICATIONS

Terada et al., "Magnetic field shimming of a permanent magnet using a combination of pieces of permanent magnets and a single-channel shim coil for skeletal age assessment of children", Journal of Magnetic Resonance, Academic Press, Orlando, FL, US, vol. 230, Feb. 14, 2013 (Feb. 14, 2013), pp. 125-133, XP028546204.

Extended European Search Report dated Feb. 23, 2022, issued by the European Patent Office in corresponding European Application No. 21195929.1. (12 pages).

* cited by examiner

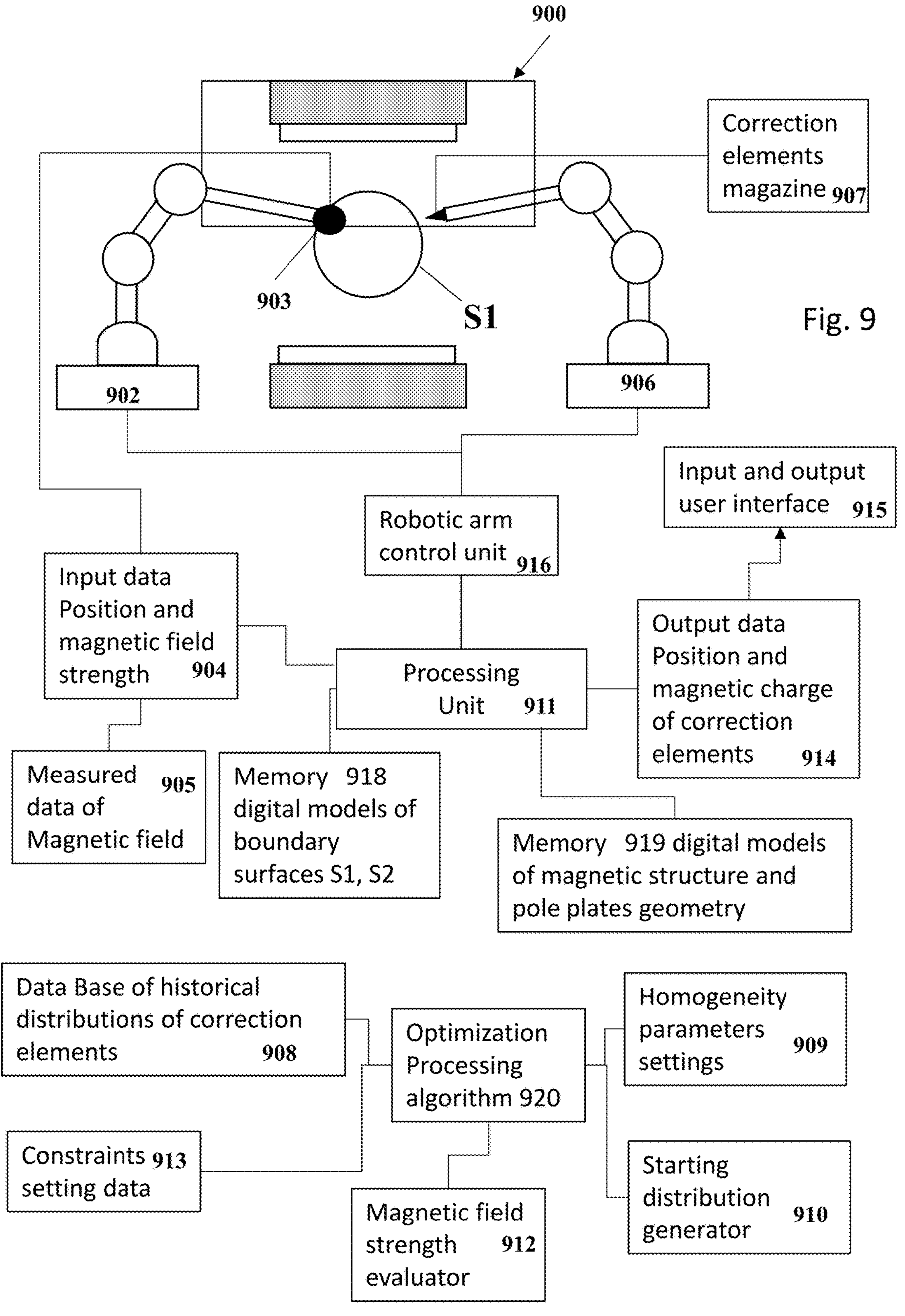
900
Correction elements magazine 907
903
S1
Fig. 9
902
906
Input and output user interface 915
Robotic arm control unit 916
Input data Position and magnetic field strength 904
Processing Unit 911
Output data Position and magnetic charge of correction elements 914
Measured data of Magnetic field 905
Memory 918 digital models of boundary surfaces S1, S2
Memory 919 digital models of magnetic structure and pole plates geometry
Data Base of historical distributions of correction elements 908
Optimization Processing algorithm 920
Homogeneity parameters settings 909
Constraints setting data 913
Starting distribution generator 910
Magnetic field strength evaluator 912

METHOD FOR CORRECTING INHOMOGENEITY OF THE STATIC MAGNETIC FIELD PARTICULARLY OF THE STATIC MAGNETIC FIELD GENERATED BY THE MAGNETIC STRUCTURE OF A MACHINE FOR ACQUIRING NUCLEAR MAGNETIC RESONANCE IMAGES AND MRI SYSTEM FOR CARRYING OUT SUCH METHOD

TECHNICAL FIELD

The present application relates to a method for correcting inhomogeneity of the static magnetic field particularly of the static magnetic field generated by the magnetic structure of a machine for acquiring nuclear magnetic resonance images.

Furthermore, the present application relates to an MRI system for carrying out the above method.

BACKGROUND OF THE INVENTION

Correction of inhomogeneities of the magnetic field of an MRI magnet structure is currently known under the denomination of shimming.

Current methods for shimming magnetic fields of MRI apparatus magnets are based on analytical solutions of equations used to describe the magnetic field generated by a distribution of magnetic material. This kind of approach is relatively long and complex and requests highly specialized service persons. The equations and the solution of the equations allowing to carry out the corrections becomes more and more complex and time consuming with the shape of the gantry and of the ideal surface describing the limits of the imaging volume. Furthermore, the trend goes towards the use of magnetic structures which are very short and also as much as possible open.

EP0940686A1 discloses a method for correcting and/or calibrating magnetic fields, particularly intended for magnets in nuclear magnetic resonance imaging equipment comprising the steps of:

i) generating a polynomial representing the magnetic field generated by the magnet and comprising a plurality of harmonic terms, each associated to a coefficient;

ii) measuring the magnetic field and sampling it in a plurality of locations, with a predetermined space distribution;

iii) determining the coefficients from the sample values in the field;

iv) comparing the measured coefficients with those describing the field with the desired characteristics;

v) defining a grid for positioning the correction elements, depending on the magnet structure and on the correlation thereof with the field structure and positioning the grid inside the magnet structure so that the contribution of the correction elements positioned on the grid adds to the magnetic field generated by the magnetic structure;

vi) calculating the position and magnitude parameters of said one or more correction elements to obtain the desired field characteristics of the magnetic structure in combination with the contribution of the said one or more correction elements positioned on the said grid;

vii) repeating, if necessary, the sampling operation and the steps ii) to vi).

Generally, the process needs more than one repetitions which adds correction elements to the grid so that the process of making the magnetic field homogeneous converges at each step to an optimal solution at least minimizing the differences between the desired magnetic field according to the computation and effective magnetic field or generating a magnetic field which has inhomogeneities lower than a predetermined maximum threshold, typically of the order of some ppm.

In order to carry out the above steps document EP0940686 the morphology of the sampling volume of the magnetic field is defined;

h) the coefficients of the polynomial which can represent the magnetic field are analyzed and subdivided into independent groups, according to the symmetries of the selected reference system and of the relevant harmonic function which is used in the description of the magnetic field;

i) the independent groups of coefficients are discriminated and ordered according to their belonging to the categories of systematic or asystematic errors, in accordance with the symmetries of the magnetic structure and with respect to the selected reference system;

j) the independent groups of coefficients so formed are separately annulled or lowered below a maxim threshold absolute value, following a series of calculation steps, for determining the number, magnetization distribution and position characteristics of the correction elements with reference to the magnetic structure.

The above steps are generally common to many differently configured shimming methods such as for example the ones disclosed in EP1748300 or US2007229077 or US2014028311.

FIGS. 1 and 2 show examples of the grid associated to a magnetic pole in a magnet structure of an MRI system which are known in the prior art.

FIG. 1A show a distribution of correction elements, obtained through the method according to the invention, and referring to a magnet of the type as shown in FIG. 1B, in which two grids are provided each one respectively associated to one of the two opposite poles. FIG. 1B shows a magnetic structure having an annular yoke. It has two opposite poles 1, 2, which delimit a cavity 3 which in an embodiment herein forms the gantry of an MRI apparatus. The two poles are at the right and at the left of the said cavity. The poles are associated to members 101, 201 made of a magnetized material, a magnetic field being generated therebetween, mainly in the direction of arrow Bz. The magnetic field permeates the entire volume of the cavity 3. Inside the said cavity a shimming volume is defined such as a spherical or spheroidal closed three-dimensional boundary surface indicated by S1. The said closed three-dimensional boundary surface S1 delimits a part of the volume of the cavity having a predetermined position relatively to the poles and a predetermined extension in the three dimensions and which is defined herein as shimming field of view S-FOV. In the example of FIG. 1B the said boundary surface S1 is centered relatively to the cavity and to the poles. The magnetic field B can be expressed on the said boundary surface and inside the volume enclosed by the said boundary surface by any type of harmonics expansion function. In the present example due to the geometry of the magnet structure and of the magnetic field and of the shimming field of view the harmonic expansion function describing the magnetic field is and expansion in terms of spherical or spheroidal harmonic functions as known by the skilled person due to his common general knowledge:

$$B(\vartheta, \varphi) = B_0 + \sum_{l,m} P_{l,m}(\cos\vartheta)(a_{l,m}\cos\vartheta + b_{l,m}\sin\vartheta)$$

in which B(ϑ, φ) is the magnetic field at the coordinates ϑ, φ.

As it will be described with more detail in the following description, a further closed three dimensional boundary surface is provided indicated by S2 which has cubic form and is defined as imaging field of view (I-FOV), enclosing a volume being the image field, this being the volume within which the corresponding parts of a target body placed inside the cavity 3 will be represented in images acquired by an MRI apparatus being provide with the said magnetic structure.

A further definition of imaging field of view may be used such as the part of the volume of the cavity in which the field shall have predetermined homogeneity parameters.

With reference to FIGS. 1A and 1B, and according to the prior art, on the poles 1 and 2 there is provided an ideal positioning grid, consisting of a sequence of concentric rings, and of an array of radiuses, intersecting them. This defines a grid of positions in angular and radial coordinates. In figure LA, the hatched elements represent the correction elements for aberrations of the magnetic field Bz are indicated as 4, 6, 6', 7. When a rotational symmetry is supposed for the imaging volume, the number of elements, the positions and the magnetization distribution of the individual correction elements may be determined for a single quadrant of the four quadrants provided Q1, Q2, Q3, Q4 and the distribution of the correction elements provided on a quadrat may be replicated on the other quadrats according to the rotational symmetry. The mathematical description of the grid related to the mathematical description of the field allows to generate an equation system, wherefrom the position on the grid and the magnetization distribution of magnetic dipoles, which form the correction elements 4, may be determined. As a rule, the calculation does not require an optimization procedure consisting in annulling the groups of systematic coefficients, but the number, position and magnetization distribution parameters of the correction elements are determined by lowering said groups of actual coefficients below a predetermined maximum threshold.

In FIG. 2, a further exemplary embodiment of the distribution of magnetic field correction elements 30 on a tray superimposed to a magnetic pole is shown. The magnetic correction elements are magnetic dipoles having a predetermined magnetic charge. Each magnetic correction element is placed in a certain position on the tray, so that the combined magnetic field of the magnet and of each of the correction elements is a magnetic field for which inhomogeneities are cancelled or deduced below a threshold of few ppm.

AS it will be apparent from the disclosures of the documents cited above carrying out a shimming operation requires both a high specialization in physics and mathematics and good skills in carrying out manual operations requesting very fine adjustments such as the positioning of the correction elements on the right place of the grid.

Currently the operations are carried out by human persons and the time requested for executing the shimming task are normally quite long and complex.

Document TERADA Y ET AL: "Magnetic field shimming of a permanent magnet using a combination of pieces of permanent magnets and a single-channel shim coil for skeletal age assessment of children", JOURNAL OF MAGNETIC RESONANCE, ACADEMIC PRESS, ORLANDO, FL, US, vol. 230, 14 Feb. 2013 (2013-02-14), pages 125-133, XP028546204, ISSN: 1090-7807, DOI: 10.1016/J.JMR.2013.02.005 discloses a shimming method of magnets for MRI apparatuses which is carried out according to a further reference. This further reference being document REN ZIYAN ET AL: "STUDY ON SHIMMING METHOD FOR OPEN PERMANENT MAGNET OF MRI", PROGRESS IN ELECTROMAGNETICS RESEARCH M, vol. 6, 1 Jan. 2009 (2009-01-01), pages 23-34, XI'055889911, USISSN: 1937-8726, DOI:10.2528/PIERM08122406 Retrieved from the Internet: URL: http://dx.dOi.oorq/10.2528/PIERM08122406>

In the disclosure of these two documents, shimming is carried out by defining a grid of discrete predetermined positions of the shim magnets or coils. The coils in said positions having a predefined effect on the static magnetic field.

Also documents US2004/036472A1 and EP1748300 A1 discloses a shimming process in which a fixed grid of positions of the magnetic elements for correcting the static magnetic field are provided.

In the shimming methods disclosed in the above cited documents the provision of a fixed grid limits to a high extent the space of the possible solutions of the shimming problem.

As it will appear more clearly from the following disclosure, by avoiding the provision of a grid of fixed positions leaves the magnetic correction elements, i.e. the correction dipoles, free to move in relation to the possible positions relatively to the magnetic poles of the magnet generating the static magnetic field.

One of the main conceptual features of the present shimming process consists in carrying out an asymmetric shimming in which the correctio dipoles are free to be positioned on the magnetic poles of the magnet generating the static magnetic field.

As it will appear evident from the above cited documents, the inhomogeneities of the magnetic field have two different origins: Inhomogeneities are introduced by the shape of the magnetic structure and this kind of inhomogeneities or aberrations are considered being of the systematic kind depending on constructive parameters of the magnet structure which is present in every identical magnetic structure; Nonsystematic aberrations or inhomogeneities which are due to the tolerances in the dimensional and relative positioning of the constructive elements forming the magnet structure as well as to tolerances of the material used in relation to the magnetic behavior of the said material. The compensation of this kind of inhomogeneities or aberrations cannot be easily predicted since it is specific and may be different for every different magnet structure. On the other hand, since each magnet needs to be subjected to a shimming operation there is a very great number of cases and the corresponding data which relates a certain initial magnetic field generated by a magnet which has not yet been subjected to the shimming to a certain distribution of correction elements on the positioning grid for such elements.

According to the shimming process known from the state of the art, the person carrying out the shimming process operates with the aid of a computer program which at each iteration step indicates to the person the correction elements to be added on the grid and their position. As it may appear clear for the skilled persons there might exist more than one solution suggested as the result of the execution of a processing step according to the above features which solutions provides for an identical correction in relation to minimization of the inhomogeneity or in relation to minimization of the differences between the computed and desired magnetic field and the effective magnetic field generated by the said correction. Currently the person carrying out the shimming selects one of the solutions suggested by the program basing the choice on its personal skills and ability. The result is that the quality of the shimming and also the duration and efforts needed to carry out the shimming process itself are user dependent and that for differently skilled or experienced user different solution are obtained so that no exact repetition of the process is ensured.

Since the choice between the alternatives furnished by the program depends mainly on the personal skills it appears very difficult to generate an objective protocol for carrying out the choice based on well-defined rules guiding the person carrying out the shimming and offering repeatable outcomes independently from the skills of the person in charge of the shimming.

Many conditions must be considered for choosing the set of correction elements representing the best solution or intermediate solution of the optimization process. Some examples are disclosed in the following list containing no exhaustive examples: correction elements determined in a following iteration step may have same or very close positions on the grid with correction elements determined in one of the previous repetition steps, determining a concentration of magnetic charge in certain positions; near or coinciding correction elements may have same polarity so that they cannot be placed in the determined position due to their mutual repulsion; near or coinciding correction elements may have different strength of the magnetic field but opposed polarity so that these correction elements may be replaced by one correction element; the correction elements on the grid which maintains the total charge of the set of correction elements is preferred to the solutions which increase more the total charge; the correction elements on the grid which provides a more homogeneous distribution of the charge on the grid are preferred to other set of correction elements which generate non homogeneous distributions of the charge on the grid.

BRIEF DISCLOSURE OF THE INVENTION

It is an object of the present invention to provide a method for carrying out the shimming of a magnet of an MRI apparatus in a simpler and less time consuming way allowing to obtain at least the same precision in suppressing or reducing the inhomogeneities of the magnetic field as for the current methods but in a fraction of the time currently needed.

It is a further object of the present invention to allow to overcome the limits of the present shimming process using a positioning grid providing pre-defined positions of the shimming dipole. These positions are the only allowed positions of the shimming dipoles on the pole plates of the magnet structure generating the magnetic field to be shimmed.

It is still an object of the present invention to provide a system for carrying out the shimming method according to the present invention.

According to an embodiment, a method for shimming a magnetic field which is generated by a magnetic structure, and which permeates a volume of space is provided comprising the following steps:

a) defining a three-dimensional closed surface enclosing a part of the volume of space permeated by the said magnetic field (named shimming Field of View);
b) measuring at least a feature of the magnetic field and sampling it in a plurality of locations of a three-dimensional grid, along the said three dimensional closed surface;
c) defining a positioning surface on each pole of the magnetic structure for positioning one or more correction elements of the magnetic field, depending on the said magnet structure;
d) calculating the position and magnitude parameters of said one or more correction elements to obtain predetermined target values of the magnetic field characteristics, optionally repeating step d) iteratively starting from the addition of the magnetic field generated by the magnetic structure and the magnetic field generated by the calculated one or more correction elements, in which
e) the target value of the magnetic field is the magnetic field homogeneity.
f) the measured and/or sampled feature of the magnetic field is the field homogeneity on the said three-dimensional grid;
g) the said correction elements being magnetic dipoles;
h) the distribution of the position and magnitude parameters of said one or more correction elements on the said poles of the magnetic structure being chosen which minimizes the homogeneity variations of the magnetic field resulting from the addition of the magnetic field generated by the said magnetic structure and the magnetic field generated by the said distribution of the position and magnitude parameters of the said correction elements on the poles of the magnetic structure which in the following will be named also as shimmed or final or optimized magnetic field.

According to an embodiment, the said position surface for the said correction elements being defined by continuous values of position coordinates, this meaning that the position surface is not approximated by a grid of predetermined discrete position points for the correction elements, but the position coordinates are represented by continuous real values.

Several different evaluation parameters of the magnetic field homogeneity may be used, such as the magnetic field peak to peak inside the Field of View or the statistical standard deviation of the magnetic field.

According to an embodiment the distribution of the position and magnitude parameters of said one or more correction elements on the said poles of the magnetic structure is chosen for shimming the magnetic field which minimizes the statistical standard deviation of the magnetic field generated by the said magnetic structure and the magnetic field generated by the said distribution of the position and magnitude parameters of the said correction elements on the poles of the magnetic structure.

According to an embodiment the said minimization of the statistical standard deviation of the magnetic field is calculated by respecting one or more constraints which are geometrical and/or magnetic constraints.

According to an embodiment the said constraints can be selected from the following list: minimal distance between the positions of adjacent dipoles on the corresponding pole and/or between the position of a dipole and already present magnetic charges on the corresponding pole plates, a maximum allowed magnetic charge of each dipole depending from its position on the corresponding magnetic pole plates or combination or sub combinations of the above listed constraints.

A variant embodiment provides for a constraint relating to the maximum magnetic charge of the dipoles as a function from their position on the corresponding magnetic plates in which the lower magnetic charges, i. e. the smaller dipoles are allowed near the central zone of the corresponding pole plate and the higher magnetic charges i.e., the larger dipoles are provided at the peripheral parts of the corresponding magnetic plate.

In the above it has to be noticed that by considering similar permanently magnetized material for the dipoles the magnetic charge is related to the dimensions of the dipole, which obviously may change if the material used for different kinds of correction dipoles, also named shimming dipoles is different in relation to its magnetization.

According to a further embodiment of the present method, a specific algorithm for minimizing the statistical standard deviation of the homogeneity of the shimmed magnetic field (according to the above definition) as a function of a distribution of one or more correction elements relatively to their position on the corresponding pole plate and to the magnetic charge of each of the said correction element while respecting at the same time one or more of the above listed constraints is chosen the said algorithm being a nonlinear programming solver and particularly a so called "large-scale interior-point algorithm".

Such kind of algorithms handles large, sparse problems, as well as small dense problems. The algorithm satisfies bounds at all iterations and can recover from NaN or Inf numerical results. More details about the interior-point algorithm are published and available from @http://calvino.polito.it/~pieraccini/Didattica/Gondzio/Gondzio_lectures_1_10.pdf which is integrated by reference herein.

Still according to a further feature of the present method, the following step may be further provided consisting of:

further to the definition of the said three-dimensional closed surface enclosing a part of the volume of space permeated by the said magnetic field (named shimming Field of View) and along which the three-dimensional grid for measuring and/or sampling the homogeneity of the starting magnetic field to be shimmed, an additional step is provided, consisting in:

defining a second three-dimensional closed boundary surface enclosing a part of the volume of space permeated by the magnetic field, the said second three-dimensional surface having a different shape than the first three-dimensional closed boundary surface and the volume of space enclosed by the said two boundary surfaces being at least partly coincident one with the other;

the said second three-dimensional closed boundary surface enclosing a part of the volume of space permeated by the magnetic field coinciding with the part of a target body which is represented and visible in an image of the said target body;

numerically evaluating the magnetic field in the part of the volume of space inside the said second three-dimensional closed boundary surface by applying a field expansion equation;

calculating from the said numerical evaluation of the magnetic field the homogeneity variations of the magnetic field for each iteration of the step d);

carrying out the step d) to h).

An embodiment of the present method provides a spherical or spheroidal surface as a first three-dimensional closed boundary surface and a cubic surface as a second three-dimensional closed boundary surface;

While the expansion function for calculating the magnetic field in the volume inside the said second cubic boundary surface is a spherical or spheroidal harmonic function of the kind:

$$B(\vartheta,\varphi)=B_0+\sum_{l,m}P_{l,m}(\cos\vartheta)(a_{l,m}\cos\vartheta+b_{l,m}\sin\vartheta)$$

in which $B(\vartheta, \varphi)$ is the magnetic field depending on the spherical coordinates $\vartheta$ and $\varphi$ are the spherical coordinates.

According to a further feature of the present method, the maximum values of the index I and of the index m are determined by:

estimating the order of magnitude of the error in experimentally measuring the magnetic field in the volume inside the said second cubic boundary surface;

and ending the expansion for indexes I and m for which the numerical error is of the same order of magnitude of the said error in experimentally measuring the said magnetic field.

According to still a further embodiment which can be provided in any combination or sub-combination with the above disclosed embodiments or variants, the step d) and/or the sequence of steps d) to e) is carried out by providing a starting distribution of correction elements, i.e., dipoles in relation to their position on the corresponding pole plate and to their magnetic charge, the said starting distribution of correction elements comprising a predetermined number N of correction elements for each pole plate;

and the position and/or the magnetic charge of each correction element is determined according to one of the listed ways or by any combination or sub-combination thereof:

i) generation of a predetermined number of different distributions of correction elements calculation of the magnetic field resulting from the adding of the magnetic field generated by the magnetic structure to the magnetic field generated by each different distribution, calculation of the standard deviation for the magnetic field resulting from each different distribution of correction elements and selection as the starting distribution for carrying out step d) or step d) to h) of the distribution of correction elements leading corresponding to the lowest standard deviation;

generation of a population of a predetermined number of randomly generated distributions of correction elements and processing the said population by an evolutionary algorithm, in particular a genetic algorithm, selecting as the starting distribution of correction elements for carrying out the step d) or the steps d) to h) the distribution of correction elements generated by the genetic algorithm having the lowest standard deviation of the magnetic field;

using a distribution of correction elements which is used and known from one or more at least similar or identical magnetic structures which has been subjected to a shimming process in earlier times and which has been saved in a database either directly as a starting distribution or as the predetermined number of populations for applying the evolutionary algorithm.

According to a further embodiment which can be provided in combination with any of the previously described embodiments or variants, a specific cost function to be minimized by the nonlinear programming solver algorithm is the following:

$$\min_x f(x) \text{ such that } \begin{cases} c(x) \leq 0 \\ lb \leq x \leq ub \end{cases}$$

in which x is the dipoles distribution, i.e. the correction elements distribution on the pole plate surfaces represented by a N×3 matrix in which N is the number of dipoles (correction elements), the number 3 is for the following parameters: the X,Z coordinates defining the two dimensional surface of the pole plates and q the magnetic charge of each dipole; c(x) and ceq(x) are functions defining respectively geometric and magnetic constraints to be respected by each distribution x; lb, ub represents the lower bounds (lb) and upper bounds (ub) for a distribution x relating to the maximum allowed X coordinate, the maximum allowed Z coordinate on the corresponding pole plate and the max allowed magnetic charge of each dipole.

Further specific constraints may be introduced in the above defined algorithm using a more generic definition of the algorithm $$\min_x f(x) \text{ such that } \begin{cases} c(x) \leq 0 \\ ceq(x) = 0 \\ A \cdot x \leq b \\ Aeq \cdot x = beq \\ lb \leq x \leq ub, \end{cases}$$

Here, x is the dipoles distribution, i.e. the correction elements distribution on the pole plate surfaces represented by a N×3 matrix in which N is the number of dipoles (correction elements), the number 3 is for the following parameters: the X,Z coordinates defining the two dimensional surface of the pole plates and q the magnetic charge of each dipole;

- c(x) and ceq(x) are functions defining respectively geometric and magnetic constraints to be respected by each distribution x;
- lb, ub represents the lower bounds (lb) and upper bounds (ub) for a distribution x relating to the maximum allowed X coordinate, the maximum allowed Z coordinate on the corresponding pole plate and the max allowed magnetic charge of each dipole.
- A ed Aeq are matrices and b, beq and ceq are vectors in which specific correlation conditions between various dipoles of the distribution x are set.

It has to be remembered that the variable x indicates the ensemble of the N dipoles of a particular distribution and that the dimension is N×3 since each dipole of the distribution is defined by a triplet of variables, namely coordinates X,Z and magnetic charge.

In order to better clarify the above definitions a certain correlation can be set as Aeq*x=beq. This correlation means that the dipoles of a distribution must be correlated or constrained among each other in such a way as to satisfy the above equation.

In a practical numerical example, an equation as the above one may be used to describe the constraint of a solution of distribution x comprising two dipoles, the sum of the charges of the said two dipoles being 4, or the equation can be set so that the position Z of a dipole is set equal to the position −2Z of another dipole.

A*x<=b is an equivalent equation defining further constraints and/or correlations between dipoles of a distribution x.

In both equations the symbol* represents the matrix product.

A numerical example could be the following:

A matrix x describing a distribution of N dipoles each one defined by two position variables X,Z and the magnetic charge is a matric having N rows and three columns;

In the example we limit to two dipoles so that N=2.

If a constraint is desired according to which the difference between the coordinates of the two dipoles is of 3 mm, a matrix $$Aeq = \begin{matrix} 1 & -1 \\ 0 & 0 \\ 1 & 0 \end{matrix}$$

And a matrix beq with $$beq = \begin{matrix} 3 & 0 \\ 0 & 0 \\ 0 & 0 \end{matrix}$$

May be used to translate in mathematical form the said constraint.

Then Aeq*x with x being $$x = \begin{matrix} X1 & Z1 & q1 \\ X2 & Z2 & q2 \end{matrix}$$

Will give the following solution $$Aeq * x = \begin{matrix} x1 - x2 & 0 & 0 \\ 0 & 0 & 0 \\ 0 & 0 & 0 \end{matrix}$$

Which has to be set equal to beq for each element of the matrix so that at the end the desired constraint x1−x2=3 is represented.

In order to better clarify the meaning of the definition three-dimensional closed boundary surface enclosing a volume of space, the said surface is an ideal boundary surface and which has a predetermined size, a predetermined shape of the boundary surface and a predetermined relative position in respect to the magnetic structure generating the magnetic field.

According to a further aspect an embodiment of a method for shimming a magnetic field which is generated by a magnetic structure, and which permeates a volume of space is provided comprising the following steps:

i) measuring the magnetic field in a predetermined region of a volume of space permeated by the said magnetic field;

ii) determining at least a parameter which is a measure of the homogeneity of the said magnetic field;

iii) defining a distribution of correction elements consisting in a predetermined number of magnetic dipoles having each one a predetermined magnetic charge and a predetermined position relatively to the magnetic structure generating the magnetic field;

iv) calculating the charges of each of the dipoles and the position of each of the said dipoles of a distribution which minimizes the said parameter being a measure of the homogeneity of the magnetic field;

v) reconstructing a virtual representation of the magnetic structure and of the dipoles placed on the said magnetic structure and displaying the said virtual representation as one or more images;

vi) defining at least a plane crossing the volume of space permeated by the said magnetic field and generating a graphical representation of the magnetic field intensity map on the said plane related to the addition of the magnetic field of the magnetic structure to which the magnetic field of the calculated distribution of dipoles is added;

vii) optionally repeating iv) to v) by using as a starting distribution of dipoles the dipoles calculated in the previous minimization step of the parameter measuring the magnetic field homogeneity and by refreshing the images generated and displayed at steps v) and vi) sing the new calculated distribution of dipoles;

viii) ending the said repetition at a certain number of repetition steps and/or when the parameter describing the field homogeneity has reached a predefined threshold and using the distribution of dipoles calculated by the last repletion step as the shimming distribution of dipoles to be positioned on the magnetic structure.

According to a further embodiment the parameter measuring the magnetic field homogeneity is the standard deviation of the magnetic field inside a predetermined volume of space;

According to a further embodiment, the steps i) to iv) are carried out as disclosed in one or more of the embodiments and/or variants of the shimming method disclosed above.

The invention is also directed to a system for carrying out the shimming of magnetic structures, particularly of magnetic structures for generating the static magnetic field in MRI apparatuses.

According to an embodiment, the system comprises:

a sensor unit for measuring the magnetic field;

a supporting structure of the said sensor unit which can be displaced at least along three spatial coordinates for positioning the sensor unit at different spatial positions the supporting structure having a predetermined position relatively to the magnetic structure;

the supporting structure comprising driving units for displacing the said structure along respectively each of the three spatial coordinates and position measuring sensors of the said supporting structure along each of the said coordinates;

a data collection unit receiving the magnetic field measures of the sensor at each spatial position and comprising a memory for saving the data pairs relating to magnetic field strength and spatial position at which the said magnetic field strength has been measured;

a processing unit comprising a memory in which at least one model of a three-dimensional grid along a first three-dimensional closed boundary surface provided within a volume of space permeated by a magnetic field, and optionally at least one model of a second three-dimensional closed boundary surface provided within a volume of space permeated by a magnetic field, the coordinate system of the said models being registered one with the other and with the coordinate system of the magnetic field;

the processing unit being configured by executing the instructions of a magnetic field measuring program to position the sensor for measuring the magnetic field at each of the positions of the grid along the said closed boundary surface by controlling the driving units for displacing the said supporting structure as a function of the said model of the three-dimensional grid and to register the field at each of the said points of the grid and the coordinates of the said points;

a processing unit executing a program comprising the instructions for calculating the magnetic field strength in the space inside the said second three-dimensional boundary surface and for calculating the magnetic field variations inside the said space;

a processing unit executing a program comprising the instructions for carrying out the steps of the method according to one or more of the embodiments or variants described above;

the magnetic structure comprising at least two magnetic poles generating the magnetic field, the two magnetic poles comprising a surface interfacing the volume of space permeated by the said magnetic field and the said surface being formed by a pole plate having a predetermined length and width and being configured to receive a set of magnetic dipoles at different positions on the said surface each dipole having a magnetic charge;

a user interface comprising input units and output units, the said output units comprising at least a display in which representation of the pole plates of the magnetic poles of the magnetic structure are shown and the representation of each of the magnetic dipoles placed on the pole plates at their position on the pole plates and optionally with the corresponding indication of the magnetic charge are shown;

the input units of the user interface comprising at least input devices for entering data and or commands.

According to an embodiment an automatic pic and place device for the positioning of the correction elements is provided, such as a robotic arm, which is provided in combination with a magazine of differently magnetically charged correction elements and a control unit of the said robotic arm which controls the pic and place operations of the correction elements on the positioning grid according to the compute distribution and which control unit receives the coordinates of the position of each correction element and the information of which kind of correction element is to be put in place at a certain coordinate on the grid from the processing unit and generates the commands to drive the robotic arm.

According to an embodiment, an MRI apparatus is provided comprising a magnetic structure generating a magnetic field permeating the space of a gantry of the said MRI apparatus and further comprising a system according to one or more of the embodiments disclosed for carrying out a method according to one or more of the embodiments and variants described above.

According to an embodiment, the MRI apparatus is provided with a processing unit for executing the instructions coded in the programs for carrying out the method according to one or more of the preceding embodiments or variants, which processing unit can be the same processing unit controlling the operations of the MRI apparatus or an additional processing unit dedicated to the shimming operations, the said programs coding the instructions to carry out the said method being saved in a memory on board of the MRI apparatus.

BRIEF DESCRIPTION OF THE DRAWINGS

FIG. 9 shows a schematic embodiment of a system for determining the distribution of correction elements of the magnetic field according to the present invention and for placing on the pole plates of the magnetic structure the determined distributions of correction elements.

DETAILED DESCRIPTION OF THE DRAWINGS

Figure 10:
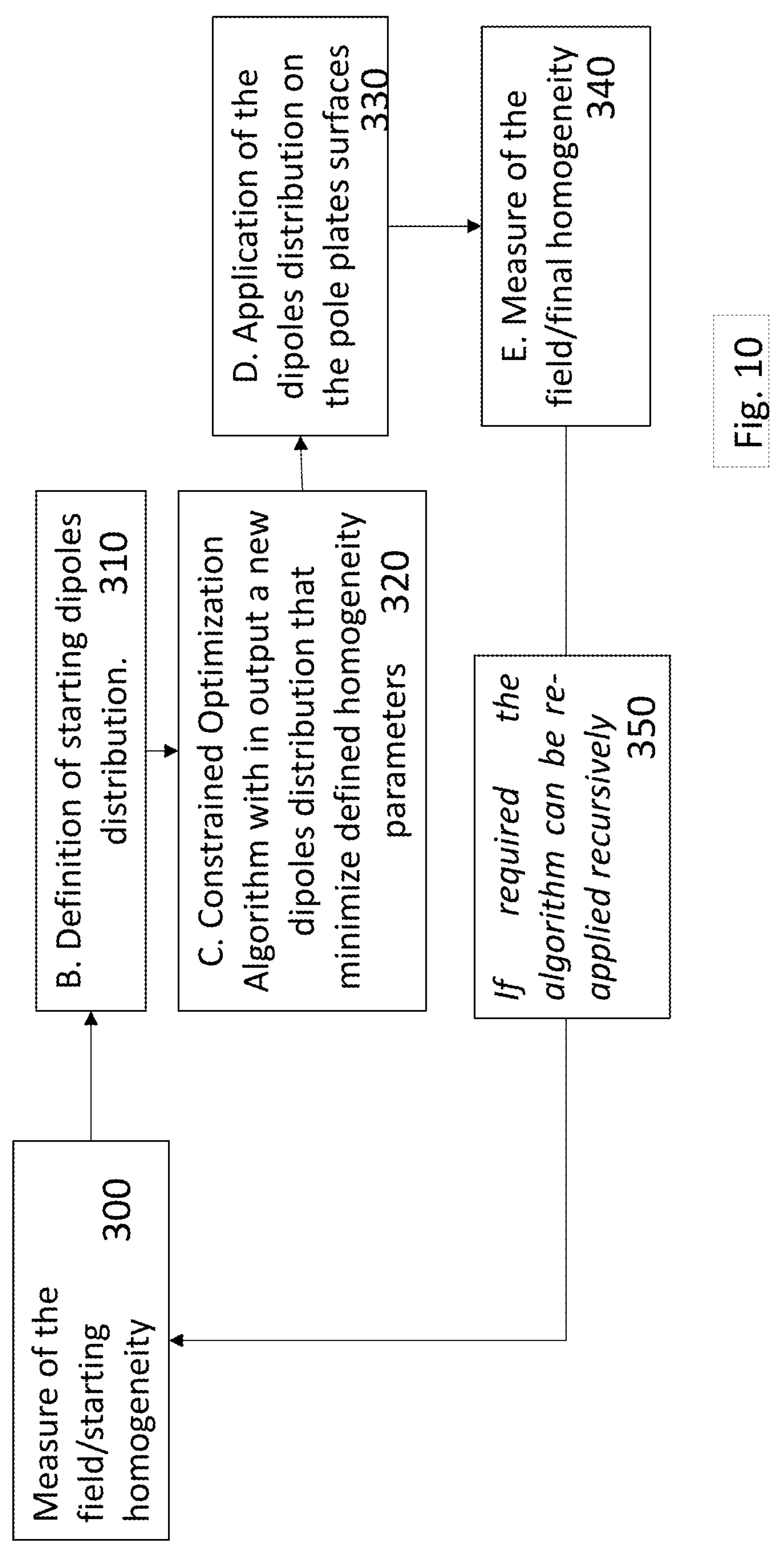
FIG. 10 is a block diagram showing a high-level flowchart of an embodiment of the shimming method.

FIG. 10 is a block diagram showing a high-level workflow of an embodiment of the method according to the present invention.

According to this embodiment the shimming method provides a starting step 300 which consist in measuring the homogeneity of the magnetic field generated by the non-shimmed magnetic structure which is also called the starting magnetic field.

Figures 1A, 1B:
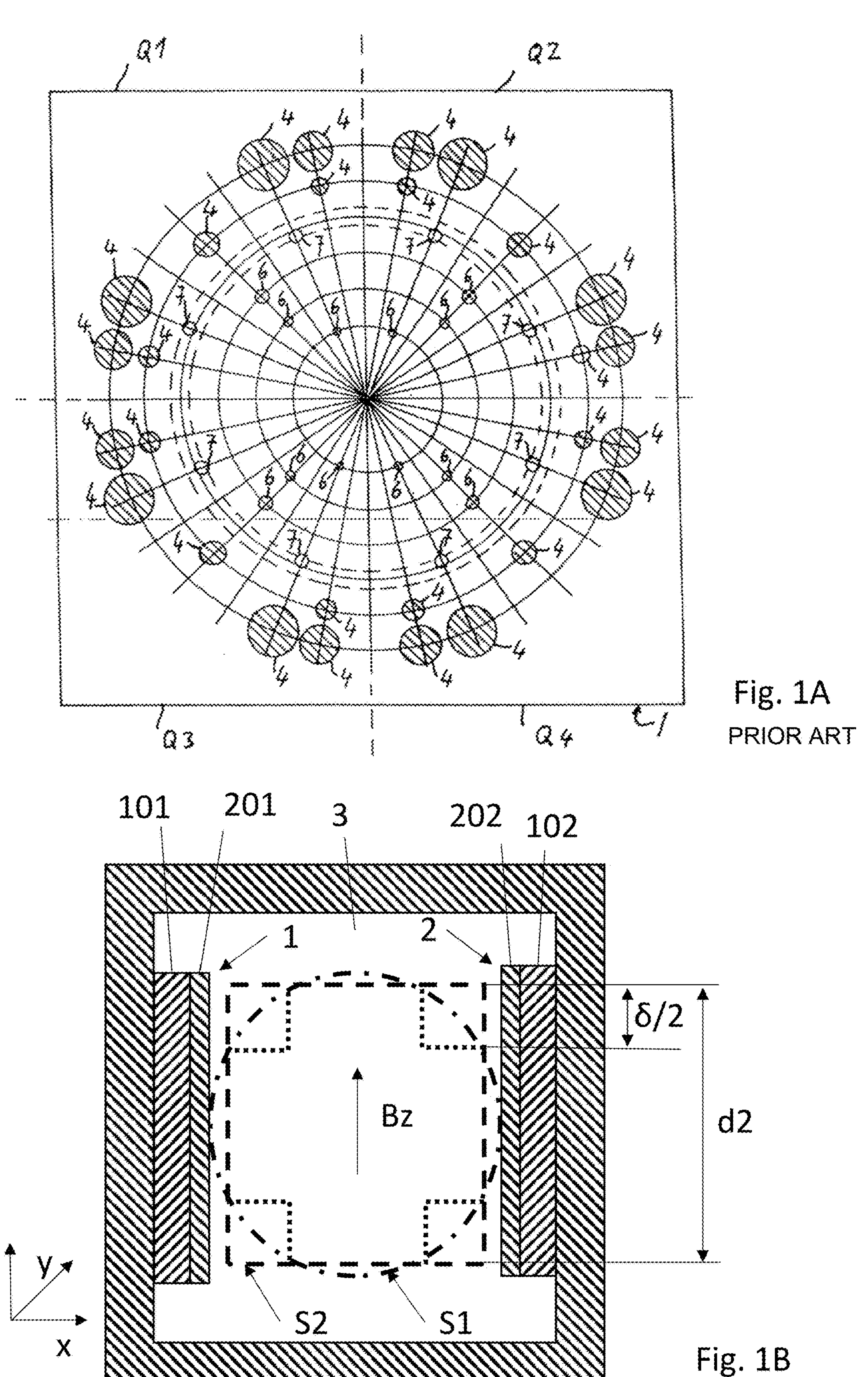
FIGS. 1A, 1B and 2 show examples of the state of the art relating to a positioning grid of a distribution of correction elements in a magnet structure of an MRI apparatus.
Figure 3:
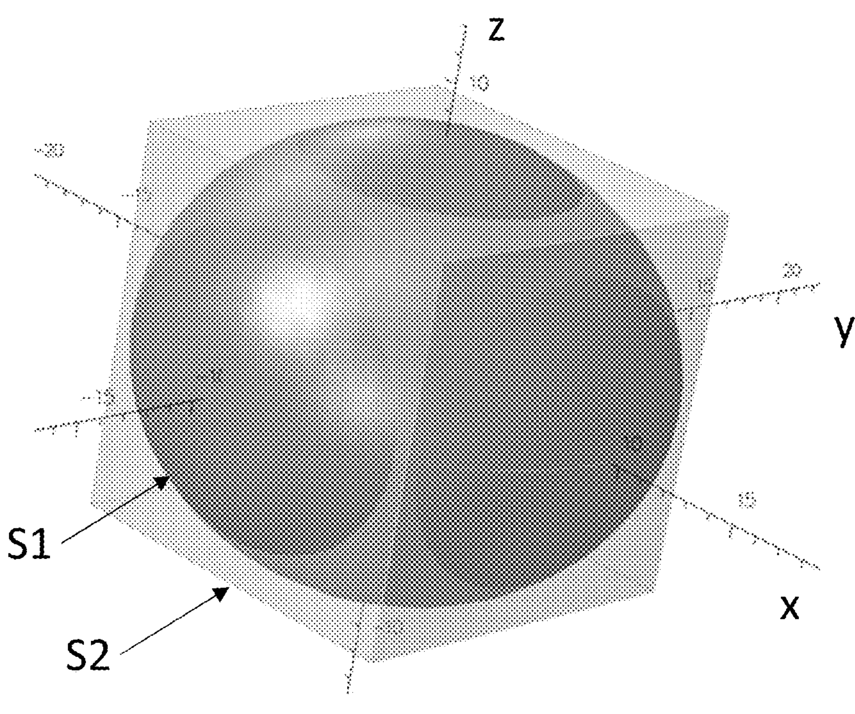
FIG. 3 shows an example of the two closed three-dimensional boundary surfaces S1 and S2, S1 being spherical and S2 being cubical and both being positioned one relatively to the other with coinciding centers.
Figure 4:
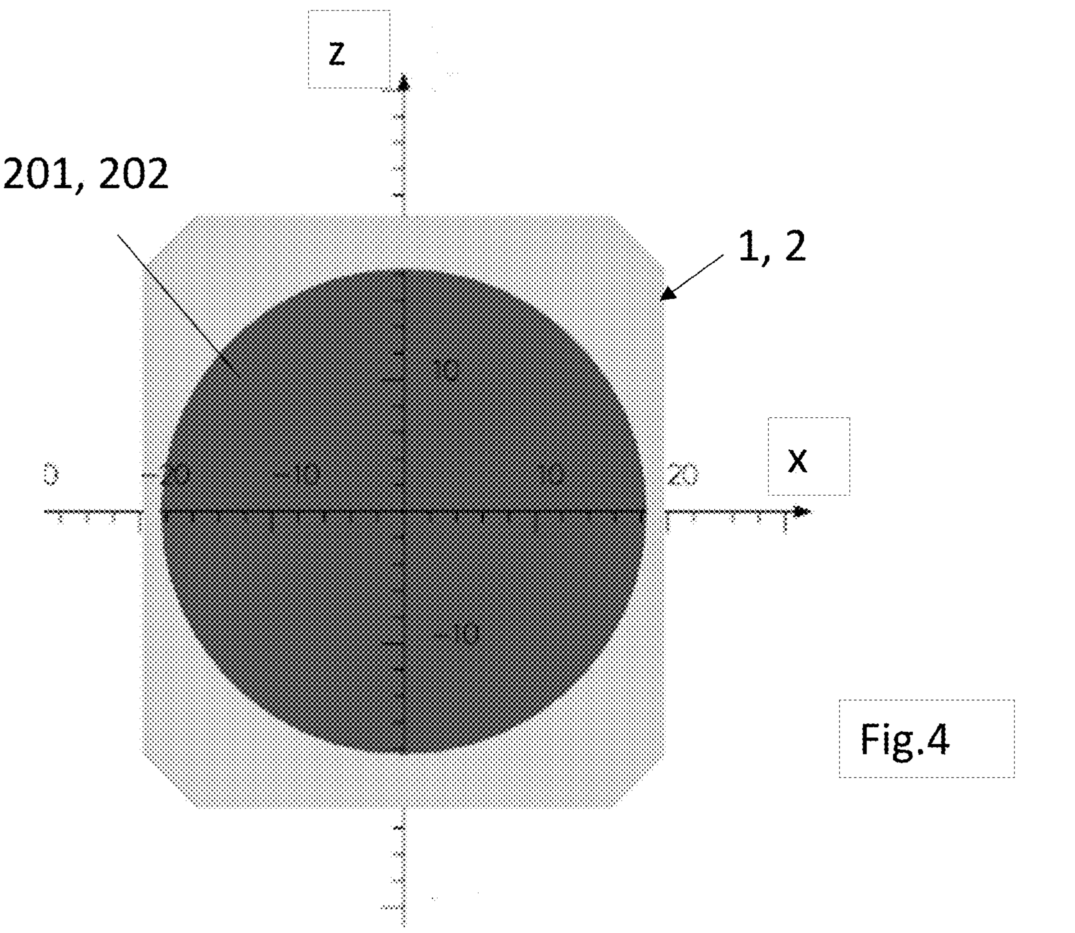
FIG. 4 shows an example of a pole and of the corresponding pole plate on which the correction elements, i.e., the dipoles calculated according to the present method are to be placed.

Different ways of carrying out this step may be used. In a preferred embodiment the step 300 is carried out by first defining a three-dimensional grid of measuring point on a three-dimensional spherical or spheroidal surface. In FIG. 1B and FIG. 3 an example of such three-dimensional spherical or spheroidal surface is shown and indicated with S1. This spherical or spheroidal surface is the closed boundary surface delimiting and enclosing a first volume which is named in the present description shimming field of view. The magnetic field strength of the starting magnetic field is measured at the points provided on the three-dimensional grid and the data field strength and coordinate of the point of the grid at which the said field strength value has been measured are saved.

Figure 2:
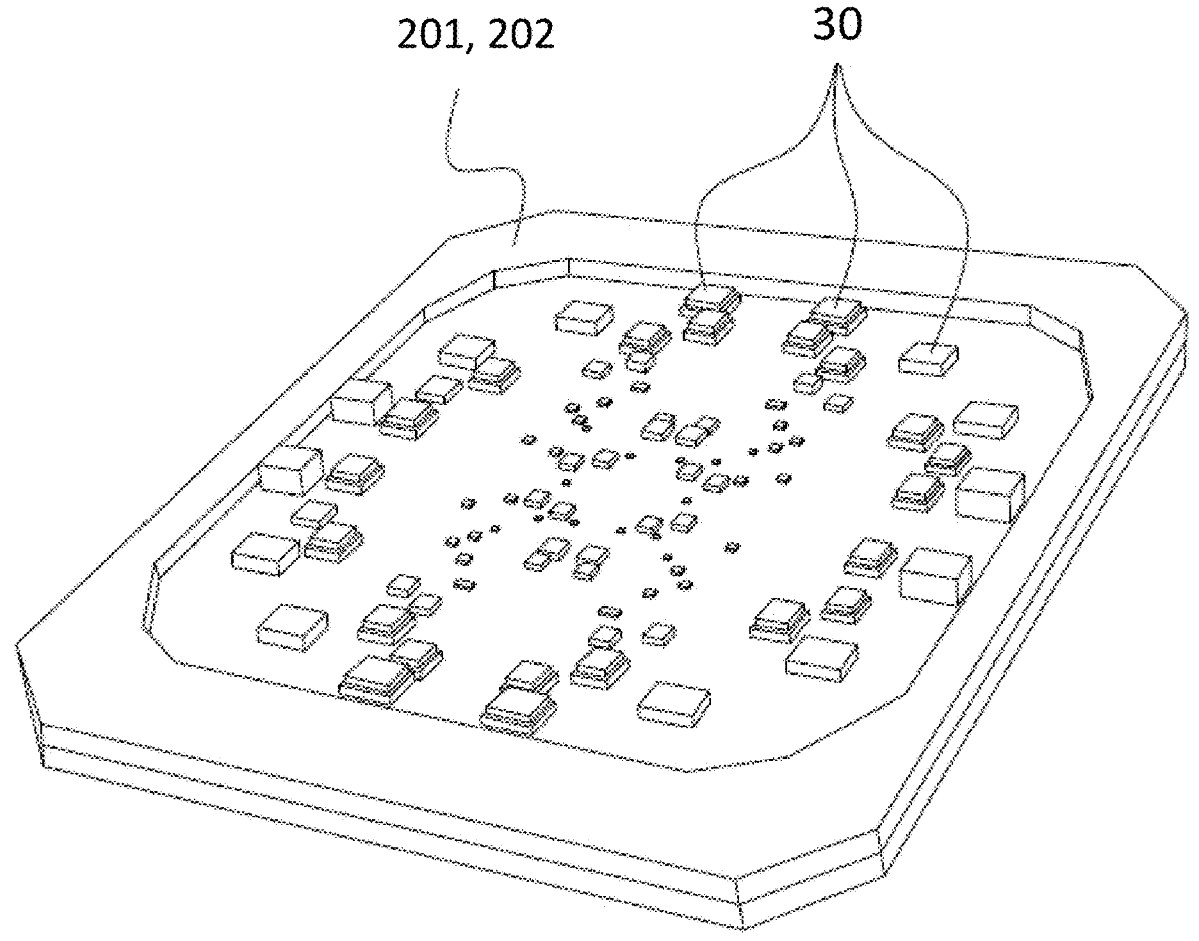
Figure 5:
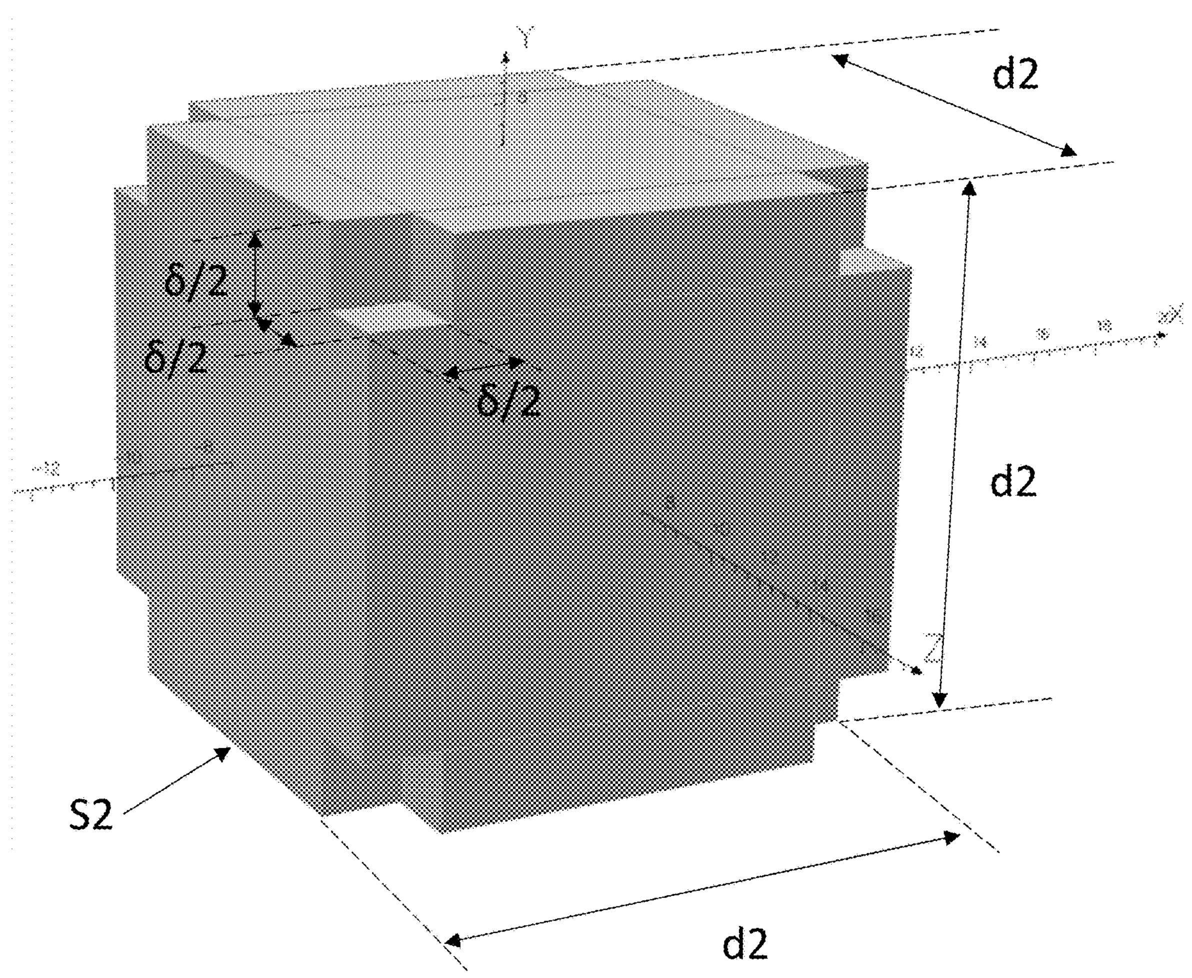
FIG. 5 shows a perspective view of the embodiment of the image field of view in which cubical indentations are provided at each of the eight corners of the cubical boundary surface.

As a further step a second closed, three-dimensional boundary surface is defined which is centered with the first boundary surface S1 and which is a cubical surface also shown in FIGS. 1B, 2 and 5 and which is indicated with S2. This surface encloses a cubical volume in which the magnetic field has to be shimmed in order to minimize the field intensity inhomogeneities to a predetermined minimum value, which for example is requested for generating magnetic resonance images having a quality appropriated for carrying out reliable diagnostics. This cubic volume is defined as image field of view when referring to the use of the present method in shimming magnetic structures of MRI apparatuses. This use is one of the possible uses of the present method but has not to be considered in limiting the field of application of the present method. In the above defined cubical volume, the magnetic field is evaluated by computation. This evaluation is carried out by using a mathematical description of the magnetic field in the form of a field expansion equation. Different kinds of field expansion equations are possible, but due to the geometrical features of the magnetic structure and of the magnetic field a field expansion equation in terms of spherical or spheroidal harmonic functions is generated:

$$B(\vartheta, \varphi) = B_0 + \sum_{l,m} P_{l,m}(\cos\vartheta)(a_{l,m}\cos\vartheta + b_{l,m}\sin\vartheta)$$

$B(\vartheta, \varphi)$ is the magnetic field strength as a function of the spherical coordinates $\vartheta$, $\varphi$; l, m are indexes of the order and degree of the harmonic functions $P_{l,m}$ and of the coefficients $a_{l,m}$ cm and $b_{l,m}$.

The numerical error of the calculated field depends on the maximum value of the indexes l and m and according to an embodiment which is non limiting but preferred, the maximum value of l and of m are calculates as the values at which the error of the numerical calculation of the magnetic field is of the same order of magnitude as the error in experimentally determining the magnetic field strength by measuring it.

Although for due of simplicity in the present example the above defined imaging field of view is related to a cubical volume, i.e. a volume of space delimited or enclosed by a cubical, closed, three-dimensional boundary surface S2, the shape of the said second closed, three-dimensional boundary surface S2 and of the enclosed volume of space is not limited by a cubical form and the choice of the shape depends as the choice of the shape of the first, three-dimensional closed boundary surface from boundary conditions such as geometry of the magnetic structure and/or of the use of the magnetic field and/or of the kind of target with which the magnetic field is destined to interact.

When choosing different shapes of the boundary surfaces S1 and/or S2, the skilled person is able to revert to its common general knowledge and choose the field expansion equation and possible constraints parameters which is more appropriate to the specific choice.

As a further step a parameter representative of the degree of homogeneity is calculated for the magnetic field determined in the said cubical volume delimited by the boundary surface S2. Many different kind parameters can be used for describing the magnetic field homogeneity, among which preferred ones are the field peak-to-peak ratio or the statistical standard deviation (STD) of the magnetic field calculated in the above defined volume called imaging field of view.

According to an embodiment which is shown in the FIGS. 1B and 5, the magnetic field can be evaluated inside a sub-volume of the above defined cubical volume.

For example in FIGS. 1 and 5 a sub volume of the cubical volume delimited by the boundary surface S2 having dimensions d2×d2×d2 (in x, y and z directions) is obtained by the union of three volumes each having a dimension d2×(d2−δ)×d2, (d2−δ)×d2×d2 and d2×d2×(d2−δ).

According to a further feature a three-dimensional cubic grid is defined in the imaging field of view, i.e. in the volume enclosed by the boundary surface S2 or in the related sub-volume and the magnetic field strength is evaluated at the crossing points of the said grid.

The pitch between crossing points of the said grid can be chosen according to the used the magnetic field is destined.

In an embodiment in which the cubic surface s2 has sides of the order of magnitude of 10 to 20 cm the pitch of the grid, i.e., the distance of the crossing points is of the order from 2 to 10 mm, preferably of about 5 mm.

The step 310 of defining a starting distribution of dipoles for modifying the starting magnetic field according to the definition given above may be carried out in several different ways. Some preferred but non exhaustive examples of steps for defining this starting distribution of dipoles are disclosed hereinafter.

In the present description and in the claims, the term dipoles mean magnetic dipoles. Magnetic dipoles are correction elements of the starting magnetic field which have a predetermined magnetic charge. The term distribution means a certain number of magnetic dipoles each one having a different position on a pole plate of 201, 202 of a pole 1, 2 and each one having a predetermined magnetic charge. Thus, the distribution has both a geometrical meaning and a magnetic meaning.

Figure 11:
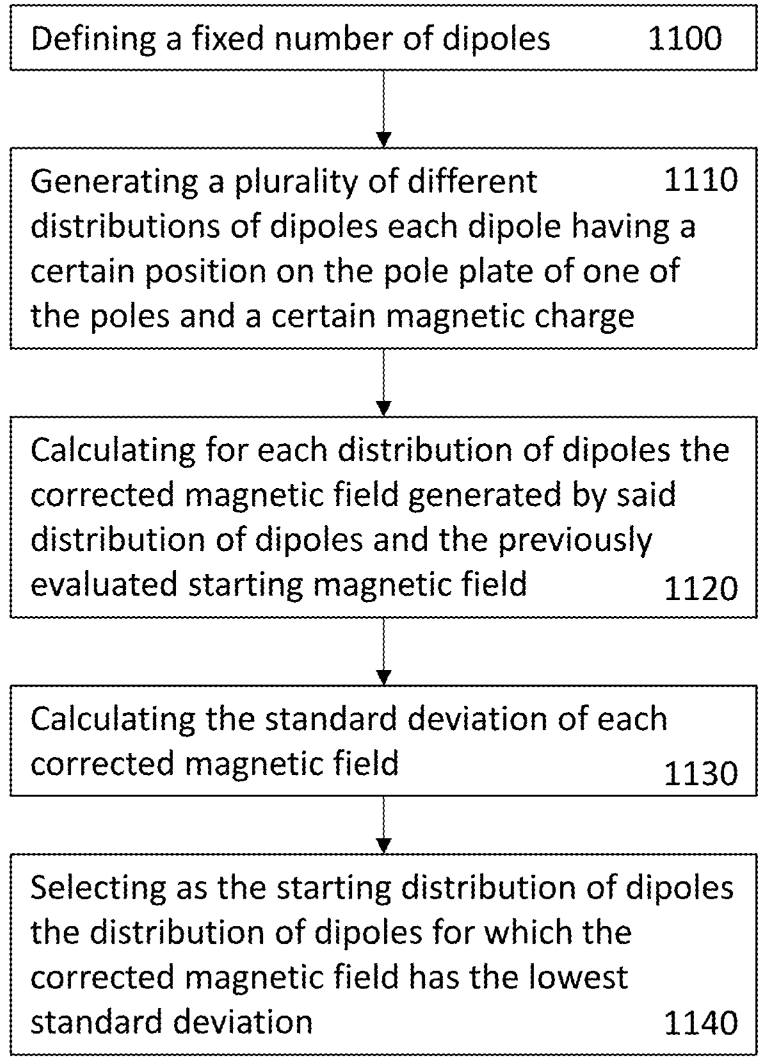
FIGS. 11 and 12 show a diagram of the process for determining a starting distribution of dipoles for carrying out the method according to the embodiment of FIG. 10 respectively using a random approach or a genetic algorithm approach for determining the said starting distribution.
Figure 12:
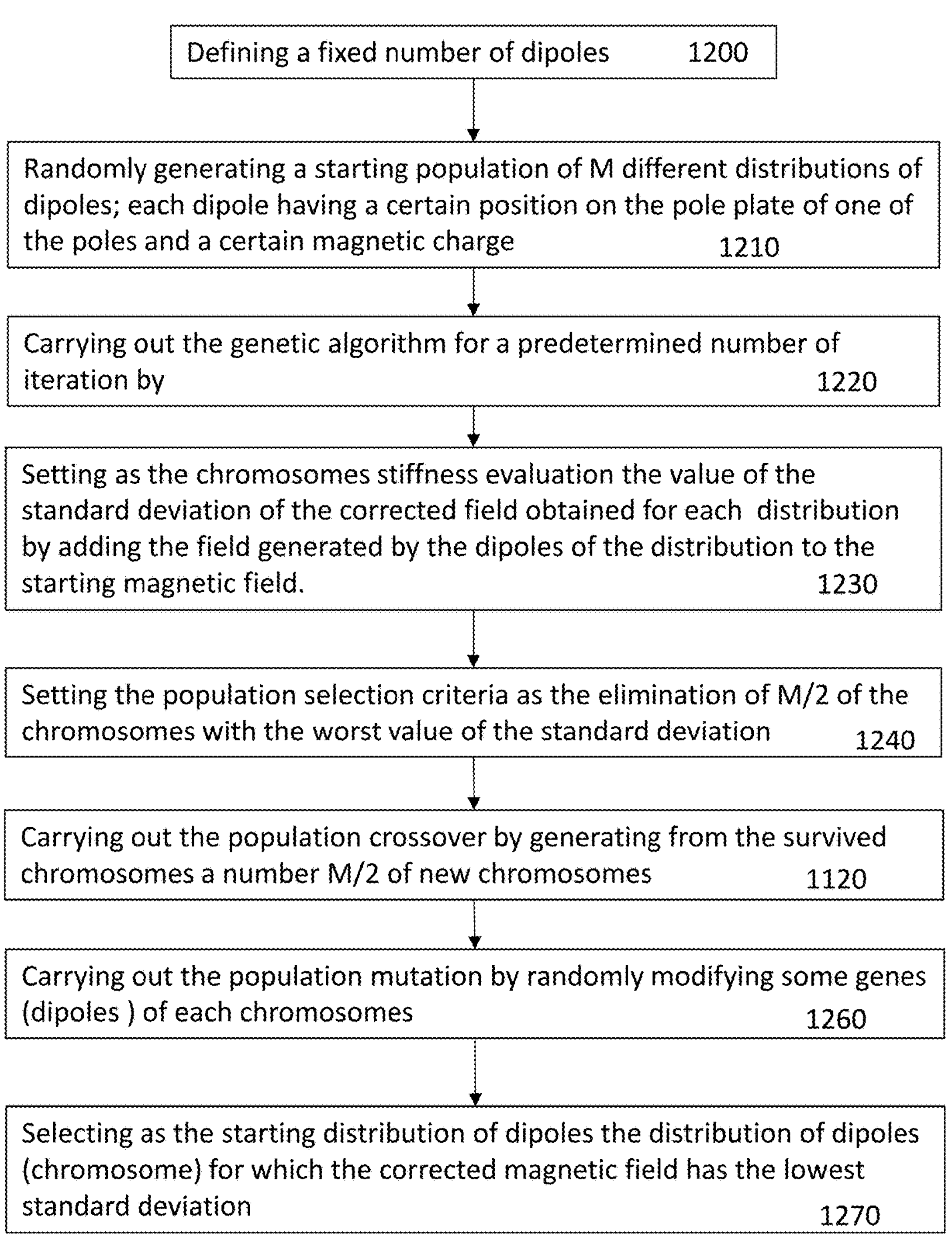

According to a first variant embodiment, the starting distribution of dipoles, i.e., the predetermined number of magnetic dipoles each having a predetermined magnetic charge and a different position on a pole plate 201, 202 is determined in a random way as indicated by the flowchart in FIG. 11. As a first step indicated by 1100 a predetermined fixed number N of dipoles is defined. The number N of dipoles is the total number of dipoles which have to be placed on each of the poles of the magnetic structure. Referring to the example of FIG. 1*b* the total number of dipoles of each distribution as to be divided onto the two poles 1 and 2 and the dipoles have to be positioned on the corresponding pole plate 201, 202. In a following step 1110 a plurality of different distributions of dipoles is generated in each of which distributions each dipole has a certain position on the pole plate of one of the poles and a certain magnetic charge. At step 1120 for each of the said distributions of dipoles the corresponding magnetic field is calculated and is added to the starting magnetic field obtaining a first corrected magnetic field for each distribution of dipoles. Foer each of the said corrected magnetic fields the standard deviation of the field is calculated as a measure representative of the degree of homogeneity of the corresponding corrected magnetic field as indicated at step 1130. Finally at step 1140 the distribution of dipoles is selected as the starting distribution of dipoles for carrying out the optimization algorithm, for which distribution the corresponding corrected magnetic field has provided the lowest value of the standard deviation.

According to a further embodiment, the starting distribution of dipoles is determined by using artificial intelligence, and particularly evolutionary algorithm. One non limiting examples of evolutionary algorithms are genetic algorithms.

According to an embodiment using a fast standard genetic algorithm as a first step a starting population of a predetermined number M of different distributions of N dipoles is randomly generated as indicated at step 1210. The genetic algorithm is carried out on the said population as parents population or starting population as indicated at step 1220. The chromosomes of the starting population of M different distribution of dipoles are evaluated in relation to their fitness, here defined as stiffness evaluation by calculating the standard deviation of the corrected field obtained by adding the magnetic field generated by a distribution of dipoles to the starting magnetic field. This chromosomes stiffness evaluation parameter is used for eliminating half of the M distributions of dipoles which give rise to corrected magnetic field having the lowest standard deviation and to use the surviving half of the M distributions of the parent population for generating by cross over a number of M/2 of new chromosomes, i.e., new distributions of dipoles as indicated at step 1250. At step 1260 also mutations can be carried out of some of the genes of the chromosomes which in the present case corresponds to changing in a distribution the position and/or the magnetic charge of one or more dipoles. The generation of new son populations from the parent population is carried out at each iteration by applying the above criteria starting from the population of M distributions of dipoles generated as the output of the previous iteration. As indicated at step 1270, after having iterated the algorithm for a predetermined number of times the chromosome, i.e. the distribution of dipoles is chosen as the starting distribution of dipoles which has produced a corrected magnetic field having the lowest value of the standard deviation.

According to a further embodiment, the definition of a starting distribution of dipoles may be obtained by referring to memorized shimming distributions of dipoles used in shimming other magnetic fields, preferably but non limiting, similar or identical magnetic fields generated by similar or identical magnetic structures. In this case a database of shimming distributions and optionally also related standard deviation values of the corrected magnetic field is generated each shimming distribution being related to a specific magnetic field and/or magnetic structure. According to a first variant the shimming distribution of dipoles showing the lowest standard deviation among the ones memorized in the database is used without any specific calculation. In a possible variant embodiment, a number M of shimming distributions from the said database may be used as the starting population for carrying out the Genetic Algorithm. Further criteria to the standard deviation of the corrected magnetic field related to the shimming distributions of dipoles saved in the database may be also applied which can be for example selecting the shimming distribution having the lowest global magnetic charge or the lowest number of dipoles or the dipoles of which distribution have a magnetic charge lower than a certain predetermined threshold value or a dimension lower than a certain predetermined threshold.

The step 320 of the method according to the embodiment of FIG. 3, consists in carrying out an optimization algorithm which provides for generating a new distribution of dipoles which minimizes the homogeneity parameter which in this case is the standard deviation of the corrected magnetic field, meaning the starting magnetic field to which the magnetic field of the said new distribution of dipoles is added. The new distribution of dipoles is generated from the starting distribution which has been determined according to step 310 and to one of the above-mentioned variant embodiments or combinations thereof. The optimization algorithm calculates the new distribution of dipoles minimizing the standard deviation by respecting one or more constraints which limits the choice of certain distributions.

A non-exhaustive list of exemplary constraints comprises:

In the case that the pole plates are empty, this meaning that no dipoles charges are already present on the pole plates:

a minimal distance between the dipoles is set in order to avoid overlaps between dipoles and thus exclude distributions which are not feasible in practice;

If the pole plates are not empty, this meaning that some dipoles are already present:

the minimal distance must also be respected between the dipoles and these charges;

a maximum allowed magnetic charge for each dipole is set.

This maximum magnetic charge for each dipole can also be a function of the position of the dipole on the corresponding pole plate. In this case according to a variant embodiment, small dipole pieces, this being equivalent with dipoles with lower magnetic charges are allowed near the center of the pole plates, and larger dipole pieces, this meaning dipoles with higher magnetic charges are allowed in the peripheral part of the pole.

In relation to the maximum allowed dipole charge the function relating this value to the position of the dipole on the corresponding pole plate can be a continuous function linear or nonlinear and tending to a limes for the said value of the maximum charge at the largest distances from the center of the pole plate, or the function can be a stepped function setting a different increasing maximum value for two or more concentric annular sectors of the pole plates having different distances from the center of the pole plates, the said maximum value for the magnetic charge being constant for the radial width of each annular sector and increasing with the radial distance of each sector from the center of the pole plate.

Figure 13:
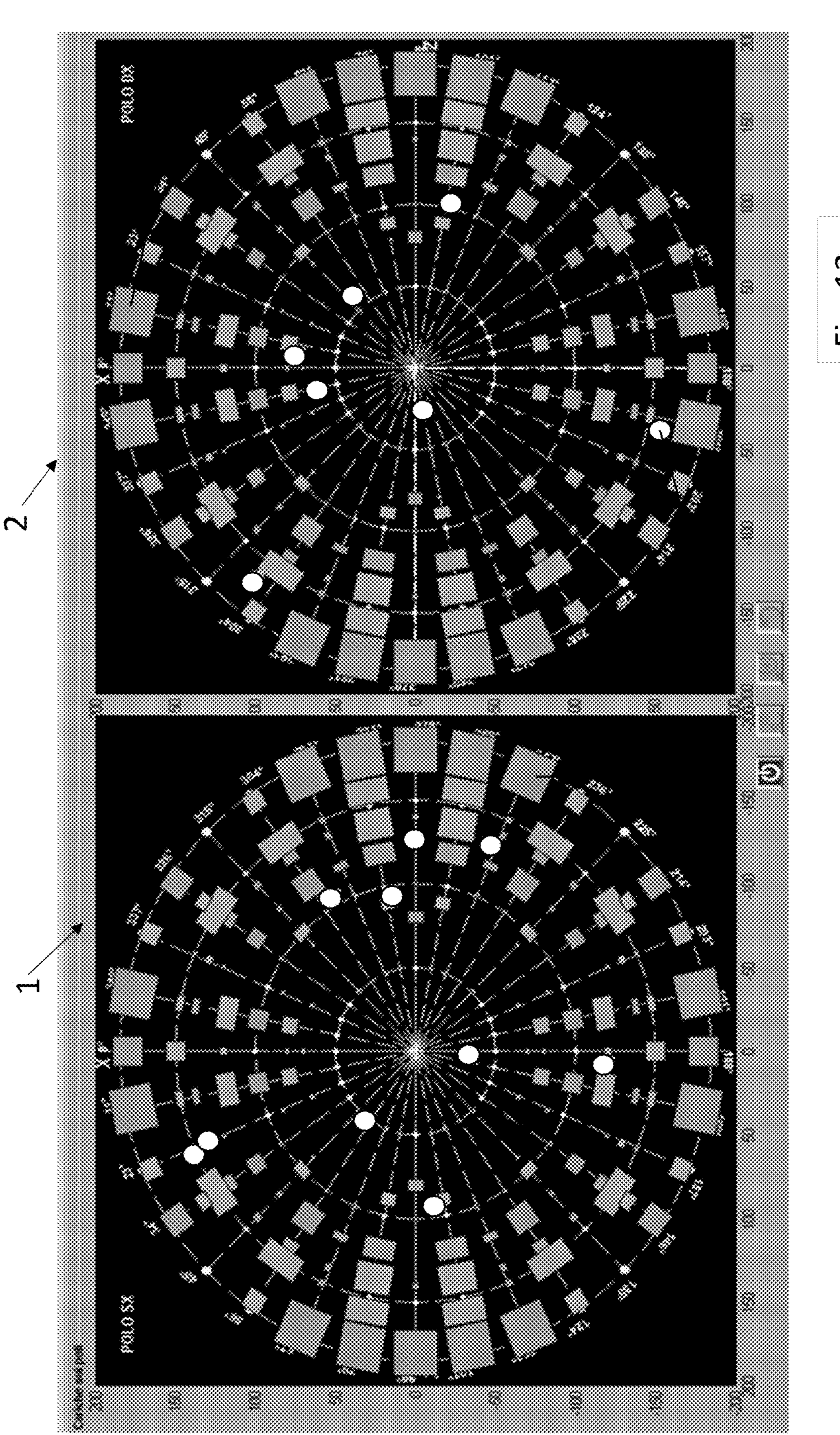
FIGS. 13 to 16 show examples of different windows of a user interface for graphically representing the output of the shimming process carried out according to the method of the present invention and for inputting commands and/or setting parameters.

Relating to the case disclosed above in which some dipoles may be already present on the pole plates, this is possible in practice see FIG. 13 showing the images of the two pole plates 201, 202 printed on the display of a human interface unit. Here the circular dots 1300 represents the distribution of dipoles generated by the method while the squared dots 1310 represents the already present dipoles on the pole plate. This already present dipoles are present resulting from the correction of systematic magnetic field aberrations which are due to the specific magnetic field structure geometry, or by shimming steps carried out by using other shimming methods as a provisional first shimming phase which is followed by a final shimming phase according one or more of the embodiments or variants of the present shimming method.

According to an embodiment of the present method, the optimization algorithm is a nonlinear programming solver that searches the minimum of a problem specified by:

$$\min_x f(x) \text{ such that } \begin{cases} c(x) \le 0 \\ lb \le x \le ub \end{cases}$$

in which x is the dipoles distribution, i.e. the correction elements distribution on the pole plate surfaces represented by a N×3 matrix in which N is the number of dipoles (correction elements), the number 3 is for the following parameters: the X,Z coordinates defining the two dimensional surface of the pole plates and q the magnetic charge of each dipole; c(x) and ceq(x) are functions defining respectively geometric and magnetic constraints to be respected by each distribution x;

lb, ub represents the lower bounds (lb) and upper bounds (ub) for a distribution x relating to the maximum allowed X coordinate, the maximum allowed Z coordinate on the corresponding pole plate and the max allowed magnetic charge of each dipole.

Further specific constraints may be introduced in the above defined algorithm using a more generic definition of the algorithm $$\min_x f(x) \text{ such that } \begin{cases} c(x) \le 0 \\ ceq(x) = 0 \\ A \cdot x \le b \\ Aeq \cdot x = beq \\ lb \le x \le ub, \end{cases}$$

Here, x is the dipoles distribution, i.e. the correction elements distribution on the pole plate surfaces represented by a N×3 matrix in which N is the number of dipoles (correction elements), the number 3 is for the following parameters: the X,Z coordinates defining the two dimensional surface of the pole plates and q the magnetic charge of each dipole;

c(x) and ceq(x) are functions defining respectively geometric and magnetic constraints to be respected by each distribution x;

lb, ub represents the lower bounds (lb) and upper bounds (ub) for a distribution x relating to the maximum allowed X coordinate, the maximum allowed Z coordinate on the corresponding pole plate and the max allowed magnetic charge of each dipole.

A ed Aeq are matrices and b, beq and ceq are vectors in which specific correlation conditions between various dipoles of the distribution x are set.

It has to be remembered that the variable x indicates the ensemble of the N dipoles of a particular distribution and that the dimension is N×3 since each dipole of the distribution is defined by a triplet of variables, namely coordinates X,Z and magnetic charge.

According to an embodiment of the present method which is non limiting and only exemplary the specific algorithm used is the "large-scale interior-point algorithm". It handles large, sparse problems, as well as small dense problems. The algorithm satisfies bounds at all iterations and can recover from NaN or Inf numerical results. A more detailed description of the interior-point algorithm can be found at: @http://calvino.polito.it/~pieraccini/Didattica/Gond zio/Gondzio_lectures_1_10.pdf. This optimization algorithm is also implemented in Matlab with the "fmincon" routine.

As shown in the high-level diagram representing the main steps of the present method following step 320, the dipoles of the calculated distribution x of dipoles can be placed on the corresponding pole plates at the corresponding positions as indicated at step 330.

A final step 340 may be provided for verifying that in practice the calculated value of the homogeneity parameter chosen, in this case the standard deviation, corresponds to the one obtained by practically placing the correction elements, meaning the dipoles, on the pole plates. As a result of this step, it can be possible that a further iteration of the steps 300 to 240 is desired or requested in order to still improve the homogeneity of the magnetic field. In this case, the starting magnetic field is the corrected magnetic field of the previous iteration cycle and the distribution of dipoles determined in this previous iteration cycle is considered as already present on the pole plates so that new dipoles of a new distribution fo dipoles determined in the following iteration cycle may be added to the ones placed on the pole plates at the previous iteration cycle.

The following iteration steps may also be carried out by skipping the steps 330 and 340 and using the theoretically determined values. In this case it can be possible that the constraints can be changed in order to allow to superimpose dipoles of the distribution determined in a previous iteration cycle with dipoles of a distribution determined in the following iteration cycle.

As it will appear with more detail in the following description, the resulting dipole distribution from an iteration cycle can be shown to the user on a display as shown in FIG. 13 and the user interface is provided with commands for manually confirming, locking, or modifying even discarding one or more dipoles of the calculated distribution of dipoles on each pole plate.

FIGS. 13 to 16 show some examples of an embodiment of a user interface provided in a system configured and able to carry out the above shimming method. Further to the magnetic structure as generically described in relation to FIG. 2, a system for carrying out the present shimming method will comprise sensors for measuring the magnetic field and for determining the point in a space at which each measure of the magnetic field has been carried out and a processing unit having a memory in which the programs encoding the instructions for carrying out the steps of the present method according to one or more of the disclosed embodiments or variants and which programs can be loaded and executed by the processing unit as well as a human interface provided with devices for displaying information in graphic and alphanumeric form and for inputting data and/or commands as well as programs for controlling the said human interface which are executed by the said processing unit. A more detailed exemplary embodiment of a system, and particularly and MRI system comprising the above features is disclosed in the following description referring to FIGS. 6 to 9.

In relation to the user interface, according to an embodiment the user may be provided with information in graphic and alphanumeric form of the results of the shimming process and particularly of the different calculation and evaluation steps disclosed above.

FIG. 13 shows a screen shot of an embodiment showing the pole plates images and the resulting distribution of dipoles calculated by the process. The image printed on a display screen of the user interface unit shows the two pole plates 201 and 202 of the left and right poles 1 and 2 of the exemplary magnetic structure according to the embodiment of FIG. 2.

In the present example white circular dots 1300 represents the dipoles determined carrying out the method according to one or more of the disclosed embodiments and variants.

With number 1310 dipoles are indicated which were already placed on the pole plates 201, 202 before starting the optimization process according to one or more of the disclosed embodiments and variants.

These dipoles 1310 are shown as squared areas of different size and are due for example in preventive shimming operations of known aberrations of the magnetic field generated by the magnetic structure and which are of systematic character, these meaning aberrations of the magnetic field which are common to every magnet structure having identical or similar configuration.

Alternatively, or in combination the said dipoles 1310 already present on the pole plates 201 and 202 can also derive from a previous shimming phase which is preceding a shimming phase carried out according to one or more of the disclosed embodiments and variants, and which previous shimming phase is carried out by using different approaches as the one for example disclosed in EP0940686A1 or in EP1748300 or US2007229077 or US2014028311.

According to an embodiment, the display of FIG. 13 can show the images of the pole plates with the distribution of the magnetic dipoles on the pole plate determined at each iteration cycle of the optimization algorithm, the images of the pole plates and of the distribution of magnetic dipoles being refreshed at each iteration in real time with the generation of the corresponding new distribution of dipoles.

According to further feature which may be provided in combination with the above display of the representation of the ole plates and of the relating distribution of dipoles, tools may be provided for interacting with the dipoles of the shown distribution for allowing to carry out one or more operations on the said dipoles.

One example provides for a point and click interface for example using a mouse or using a touch screen for displaying the images of the pole plates and of the related distribution of dipoles. By this interface it is possible to open a list of commands and/or further processing tools such as locking the pointed dipole in relation to position and/or to the magnetic charge or both the position and the magnetic charge, changing, manually, by pointing and shifting one or more dipoles along the corresponding pole plate representation the position of a dipole or changing manually by inputting the alphanumeric value of the magnetic charge of one pointed dipole or by selecting a value from a list of possible alternative values, discarding or cancelling one or more dipoles by pointing the said dipoles and choosing a discarding or erase command from a list of commands. This list of possible actions on the dipoles is not exhaustive and comprises only possible examples of cations to be carried out on the dipoles by the user interface.

According to a further variant the interface can be configured so that by pointing one dipole automatically a windows is opened showing at least the coordinates and the magnetic charge of the pointed dipole and allowing further by clicking to open a windows in which a list of one or more possible actions to be carried out on the pointed dipole are listed and may be selected by pointing and activated by clicking, for example one or more actions according to the actions in the previous disclosed list.

According to a further feature, the user interface may highlight for example with different colors the dipoles on which certain actions has been carried out and if the position and/or the charge of a dipole has been changed the interface may automatically update the windows related to the said dipole and showing the said data.

Figure 14:
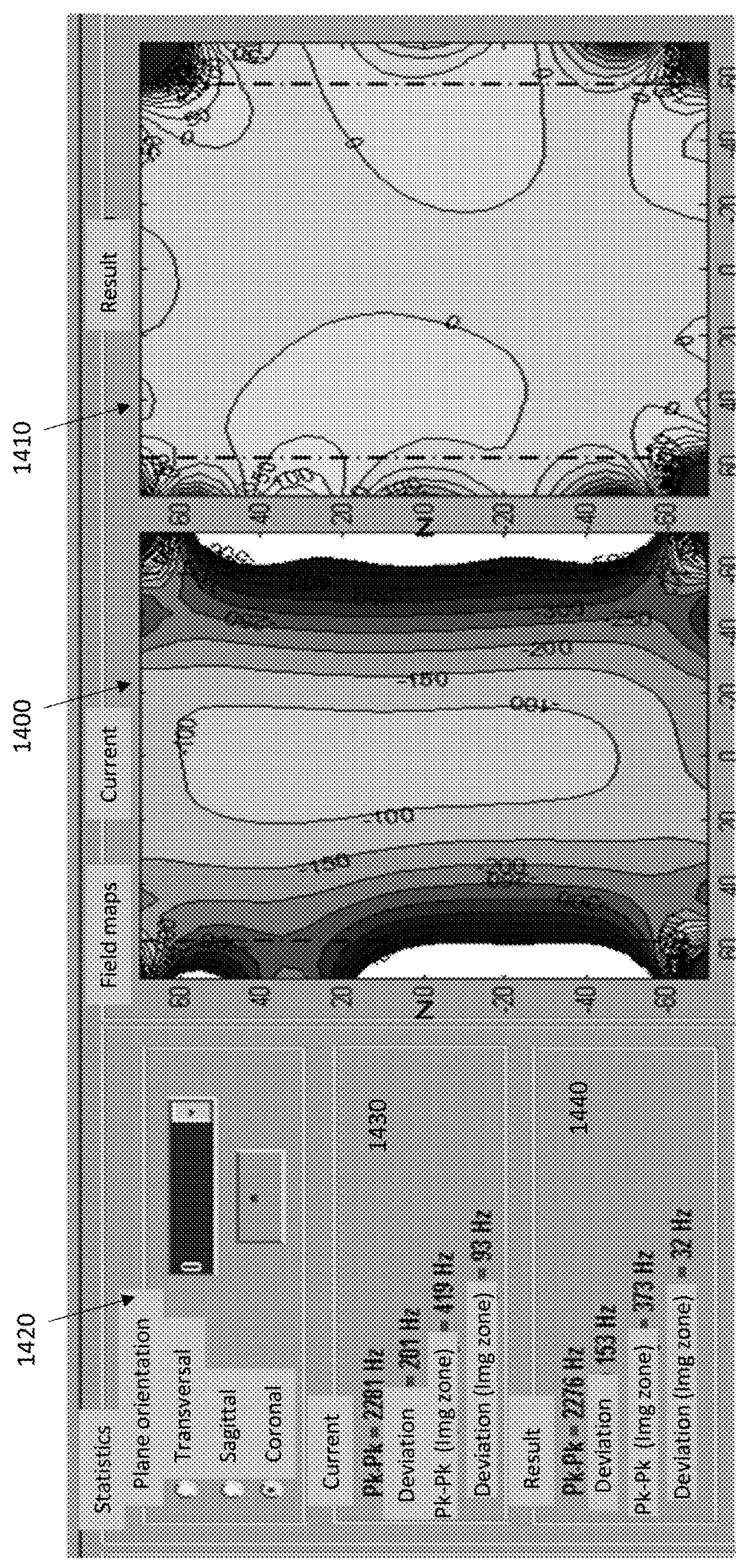

FIG. 14 shows a further image which can be printed on a display of a human interface. The image displayed can be shown in a different window which is alternatively selectable and displayable as the one according to FIG. 13. In this image windows the magnetic field maps are shown measured and/or calculated along a selectable plane crossing the volume delimited by the magnetic structure and more particularly the cubic boundary surface S2 according to FIGS. 2 to 5. Two adjacent areas of the screen, 1400 and 1410, show the field maps according to the current starting condition, for example the evaluated magnetic field from the measured one according to the steps 300 or the corrected magnetic field resulting from an iteration cycle of the present shimming method. The iteration may be carried out by repeating the steps 300, 310, 320 and 350, if the resulting corrected field according to the meaning in the present disclosure is only theoretically computed or the said iteration cycle may comprise also the steps 330 and 340 if the calculated distribution in an iteration cycle is physically applied to the pole pieces and the homogeneity parameter, i.e. the standard deviation is determined by measuring the effectively generated corrected field.

According to a further embodiment the current and resulting magnetic field maps along a predetermined and selected plane crossing the volume delimited by the magnetic structure and permeated by the magnetic field and/or the volume enclosed by one of the boundary surfaces S1 or S2, in particular, the cubic boundary surface S2, is shown for each iteration cycle of the shimming method. According to a possible optional feature, at each iteration step the distribution of dipoles and the starting magnetic field (current magnetic field) and the resulting magnetic field are saved allowing upon command from the user to be displayed in sequence. Such command may be given to the system by a command input tool such as for example a point and click tool, for example a mouse or by the touch interface of a touchscreen. The same tool can also be used for selecting a specific plane orientation along which the field maps have to be generated and displayed and/or for navigating the sequence of the current and resulting field maps related to the sequence of iteration cycles of the shimming process.

According to a further feature, the user interface windows of FIG. 14 has also a field in which the user can select the orientation of the plane along which the field maps has to be calculated and displayed as indicated by 1420 and also a field in which the position of the said plane should have in relation to a reference position such as a parallel plane crossing the center of the said volume of space according to the above disclosed alternatives for defining the said space. Furthermore fields 1430 and 1440 are provided in which the homogeneity parameters obtained for the current and for the resulting magnetic field are displayed in the form of a peak to peak value and or a standard deviation. In the variant embodiment the above indicated standard deviation parameters are given globally for the volume enclosed by the boundary surface S1 or for the volume enclosed by the magnetic structure and for the volume enclosed by the boundary surface S2. For this last case the reference is made to an image zone, which is defined as such since the example shown is related to the implementation of the shimming method in an MRI apparatus and the second boundary surface S2 encloses a volume, preferably cubic in which the MRI image data are acquired for generating images of a target body, the so-called image field of view defined in the preceding description.

According to a further feature the user can switch from the display window according to FIG. 13 and/or according to FIG. 14 to a window allowing to modify the settings of the processing algorithm and to carry out a new shimming process starting from the first iteration or from the result of a following iteration.

Figure 15:
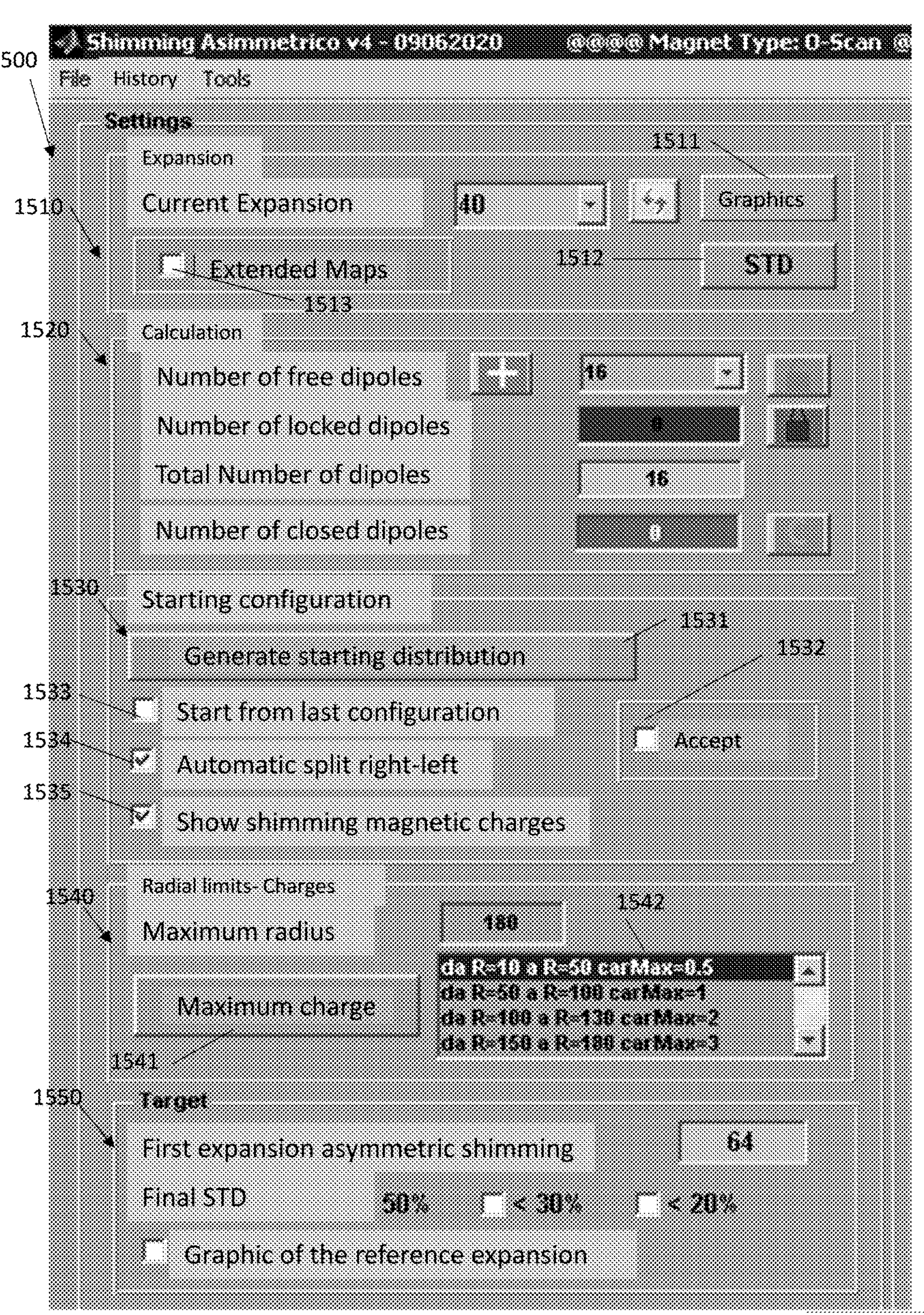
Figure 15B:
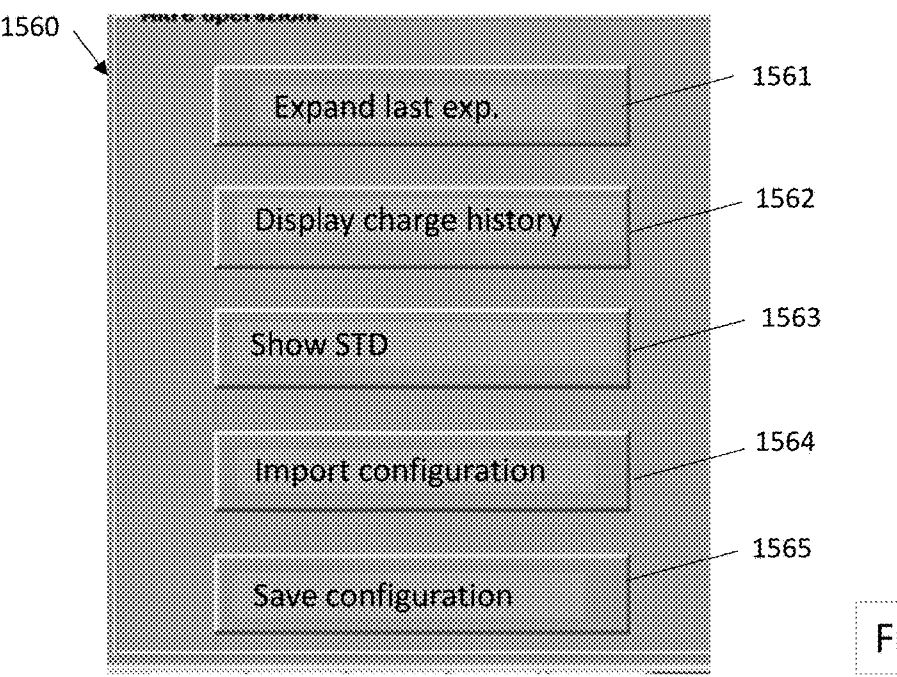

FIGS. 15*a* and 15*b* show examples of windows relating to user setting data information and user setting input data and of input of commands relating to the executing of steps of the shimming process.

Window 1500 is a typical MS-Windows®. An upper bas has labels for choosing the action options such as File, History, Tools the present label activated is related to the settings The first field 1510 displays data on the current field expansion buttons 1511, 1512 and a selection box 1513 allow to enter commands by point and click with a mouse or by touch in combination with a touchscreen. The commands relate to the calling of providing a graphic representation of the settings and or setting the standard deviation or choosing the option to show extended maps of the magnetic field.

The field 1520 shows the settings relating to the number of dipoles and their status. The field 1530 allows to input settings relating to the generation of a starting distribution of dipoles and shows a command button for carrying out the generation indicated by 1531 and an acceptance field indicated by 1532. Different options may be selected for the generation of the starting distribution by using the selection flags at 1533, 1534 and 1535.

Field 1540 is directed to input and display the radial limits of the dipole dimensions and the maximum magnetic charge of the dipoles. A command button 1541 allows to select options which are provided among a list of different alternatives shown in the window 1542 and which may be selected by pointing and clicking or other equivalent input means as for example by touch in combination with a touchscreen.

Field 1550 allows to set the expansion parameters, the final standard deviation and to select a graphic representation of a reference expansion.

Windows 1560 has a plurality of command buttons indicated by 1561, 1562, 1563, 1564 and 1565 which allow to activate certain functions or tools like expanding the last expansion, display the charge history, show the standard deviation value, import a configuration of a shimming distribution of dipoles and/or of the setting of the process, and save such a configuration. Many other possible tools or actions can be provided depending on the context in which the present method is used, the above list being non exhaustive and only an example referring to a specific case of shimming a magnet of an MRI apparatus.

Figure 16:
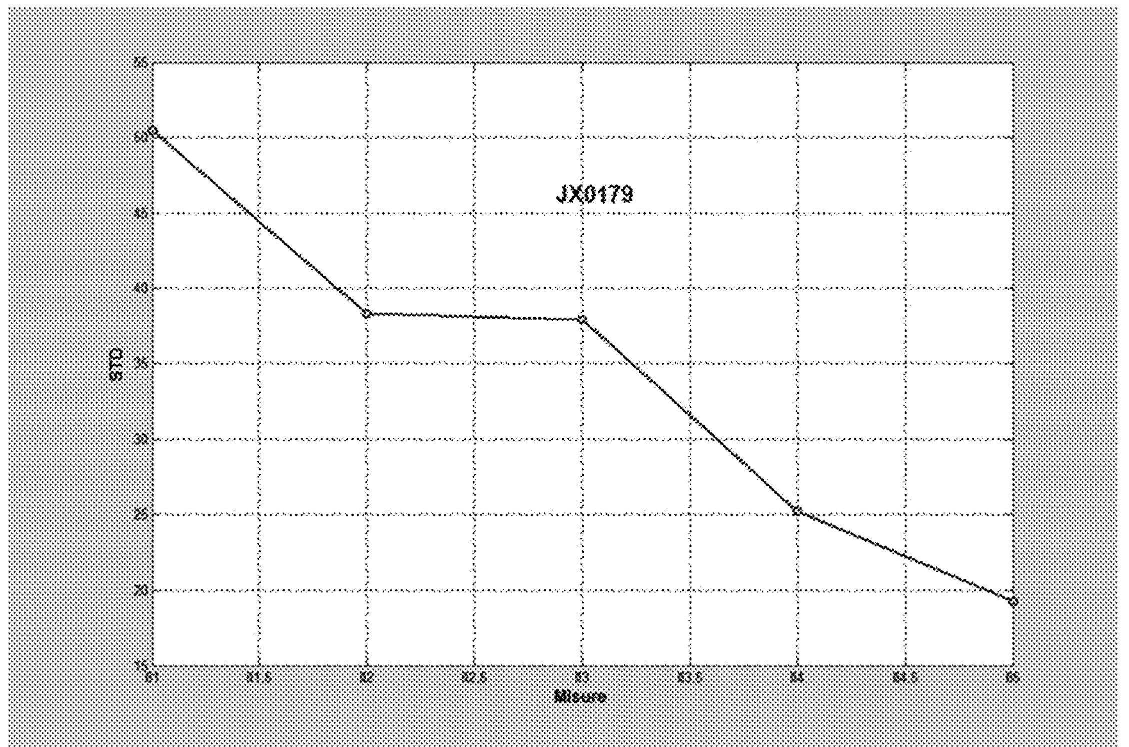

As shown in FIG. 16 a graphic output may be displayed of the development of the standard deviation of the magnetic field during the execution of the iteration cycles of the optimization process of the distribution of dipoles. Here the graph represents the development of the standard deviation of the magnetic field from the starting magnetic field up to the fourth iteration cycle of the optimization process. The standard deviation is lowered at each iteration cycle.

In relation to the method disclosed above it is relevant to notice that differently from the standard shimming procedures of the state of the art the field homogeneity is improved minimizing the standard deviation of the magnetic field and not the absolute values of the coefficients of an expansion function describing the field strength as for example in EP0940686A1 or in EP1748300. Furthermore, in the shimming procedures according to the state of the art the distribution of the dipoles on the poles is symmetrical, while in the present case this condition is not necessary to be met. According to a further features the dipoles must not be positioned on fix positions defined by a grid on the pole plates but can be freely positioned on the pole plates.

In the following an embodiment of a system for carrying out the above disclosed method is described. This embodiment refers to a system which is integrated in an MRI apparatus, which is the main field of application of the above-described shimming method but not the only possible one. Thus, the embodiment described with reference to FIGS. 6 to 9 has to be considered non limiting and only an example. It has to be noted that the essential operative units for a more generic system for carrying out the shimming method disclosed above are described in the previous description and can be clearly identified and recognized by the skilled person.

Figure 6:
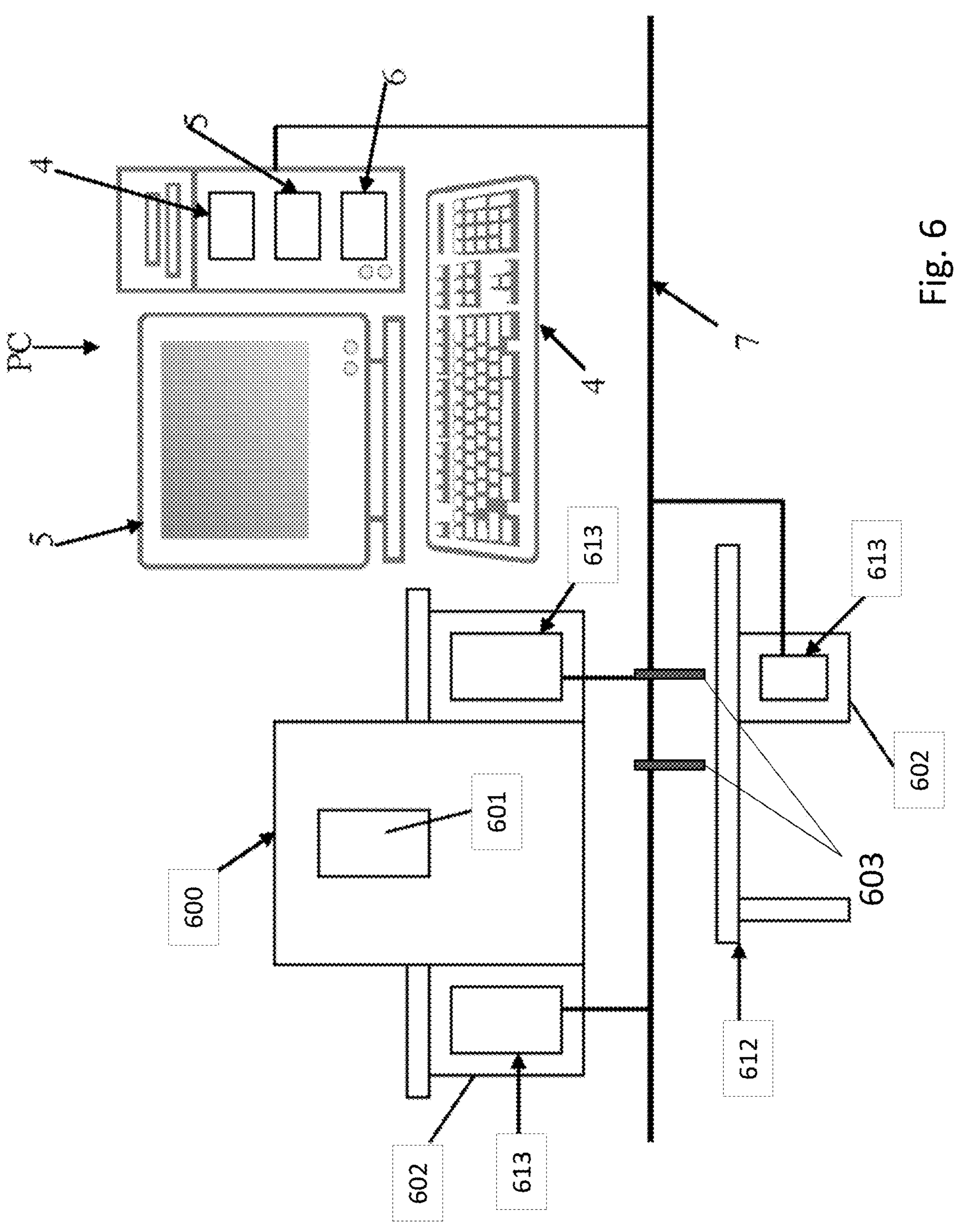
FIG. 6 shows a schematic view of an exemplary embodiment of an MRI apparatus.

With reference to FIG. 6, an embodiment of Nuclear Magnetic Resonance imaging machine suitable to be configured for carrying out the shimming method according to one or more of the embodiments and/or variants disclosed above comprises a signal exciting and receiving unit consisting of a magnetic unit 600. The magnetic unit includes permanent or resistive or superconducting magnets for generating a static field inside a cavity 601 which is designed to receive the patient body or a part thereof, particularly a limited anatomic region, such as a leg, an arm, the head, etc.

As is generally known, different coils are associated to the static field generating magnet, including:

- excitation coils, for exciting nuclear spins;
- magnetic gradient generating coils, for selecting the section plane along which imaging has to be performed, for encoding nuclear spins to univocally identify the signals transmitted at a predetermined space position and univocally assign the received data to a predetermined pixel of a pixel matrix which forms the displayed image;
- receiving coils, for receiving magnetic resonance echoes.

Also, other means are provided, such as temperature control sensors and/or means for heat increase or generation and means for heat dissipation, which are designed to set and maintain a predetermined operating temperature, etc.

Numeral 603 indicates diagrammatically two correction elements positioning trays provided with a positioning grid according to the examples of figures LA, 1B, and 2. The said trays 603 are placed on the magnetic poles of an MRI magnetic structure or are integrated in the pole construction, for example in chambers provided in the poles.

All the above elements are well-known and widely used in Nuclear Magnetic Resonance imaging machines of any type and size, both for total body machines, i.e., those designed to accommodate the whole patient body or a substantial part thereof, and for dedicated machines, i.e., those adapted to only accommodate specific limbs or limited parts or regions of the patient body.

The geometry of the magnetic structure, i.e., of the cavity for accommodating the body under examination or the part thereof may also be of any type, and particularly either of the open C- or U-shaped type, or consisting of two poles separated by columns, or of the annular, closed type.

The machine shown in FIG. 6 is a non-limiting exemplary embodiment having a closed, i.e., annular magnetic structure and the cavity is only open at the two end sides transverse to the axis. C or U-shaped magnets have three open sides, while other magnets are formed by only two opposite poles which limit a gantry being opened along the peripheral sides of the two poles. Also magnets comprising a limitation only on one side which is formed for example by only one pole plate, the object to be imaged being placed on one side of the said pole plate which is completely exposed to free environment.

In an embodiment a patient table or seat, which may have any construction and is denoted with numeral 602, is generally associated to the magnetic unit. Several embodiments of the patient table or seat are possible. According to one embodiment, the patient table or seat 602 may have a structure adapted to form closable housing compartments, as is schematically shown in FIG. 6. According to other embodiments the patient table may be in the form of a movable table having wheels and/or combined with elevator means and/or combined with means for changing the configuration of the table and/or a table having at least one table plate which is tiltable in order to be oriented along several directions, such as for example in the tables for carrying out weight bearings examinations.

The magnetic unit or structure, with the components listed above, is associated to control, monitoring and processing units, which have the function to control and adjust the various components of the magnetic structure and to receive and process echo signals to extract therefrom all data useful for the reconstruction thereof into an image formed by an array of light image dots, the so-called pixels, whose brightness and/or color are univocally related to the received data and whose position is related to the position, within the body part under examination, wherefrom the echo signal was transmitted.

According to an embodiment the MRI system comprises an electronic unit 613 for controlling the signal exciting and receiving devices, a unit 4 for entering commands to the signal exciting and receiving unit, a display and image processing unit 5 and a filing and storage unit 6 are associated to the magnetic unit.

In the present embodiment of FIG. 6, the unit 613 for controlling the signal exciting and receiving devices is at least partly contained in the case of the magnetic unit 1 and/or possibly also at least partly contained within the structure of the patient table 612, in one part thereof 602, for instance a support column, having the form of a switchboard.

The units for entering commands 4 to the signal exciting and receiving units, for display and image processing 5 and for filing and storage 6 are included, partly as hardware peripherals and partly as software programs, in a traditional personal computer.

The communication between the unit 613, contained in the case of the magnetic unit and/or in the structure of the patient table, with the units 4, 5, 6 of the control consoles provided by the personal computer is obtained by means of a communication bus denoted with numeral 7.

The communication bus may be of any type, e.g. a conventional communication bus of the Ethernet type, of the SCSI or USB type or of any other type, which allows multiplex communication among several units.

Once the type of bus to be used is selected, the implementation of interfaces with the bus 7 on the individual units 613, 4, 5, 6 is well-known in the art.

The above electronic units may be formed by specific developed boards which circuits are dedicated to carrying out the specific tasks or by generic hardware which comprises processors configured to carry out program instructions which enables the generic hardware to carry out the specific tasks.

Electronic units may be produced according to several techniques available for the construction of electronic boards and circuits.

Different programing languages and operative systems may be employed for generating the control programs providing the processors to execute the instructions for carrying out the specific tasks, such as for example Windows NT® based program languages or similar.

Figure 7:
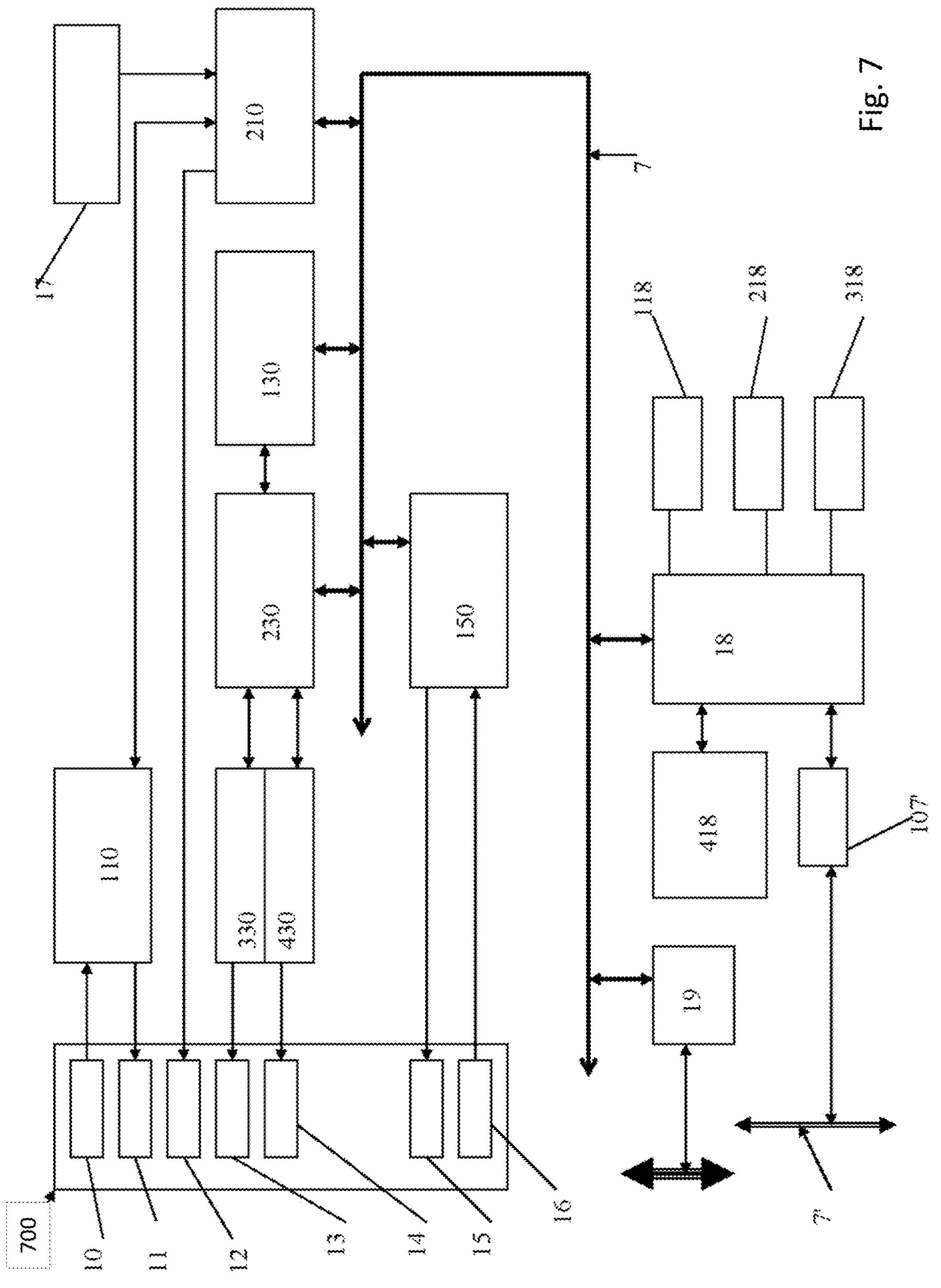
FIG. 7 shows a block diagram of a higher-level embodiment of the generic embodiment of FIG. 6.

FIG. 7 shows a block diagram of a higher-level embodiment of the generic embodiment of FIG. 2. In this embodiment, the magnetic unit 700 includes several components, as shown in the figure, that is, in addition to static field generating magnets, temperature sensors 10, heating and/or cooling means 11, at least one compensation coil 12, at least one transmission or excitation coil 13, one or more gradient coils 14, tuning means 15 and at least one receiving coil 16, as well as one or more magnetic field sensors 17.

The temperature sensors and the heating and/or cooling means are controlled by a temperature control unit 110 which includes means for reading the signals of the sensors 10 and means for supplying the heaters and/or coolers 11, which are controlled by a thermal control unit 210 based on the actual detected temperature and on the comparison thereof with the preset nominal values.

The thermal and magnetic control unit also controls the compensation coil 12 to correct the static magnetic field with reference to the variations induced therein by external magnetic fields and based on the actual field values detected by the magnetic field sensors 17. A supervision, pre-processing and reconstruction unit 130 controls a data capture and control unit 230 which in turn controls the amplifiers 330 and 430 for the signals provided to the transmission or excitation coil 13 and to the gradient coil/s 14 respectively. A receiver unit 150 is responsible for tuning 15 the receiving coil 16 and identifying the receiving coil 16, as well as for receiving the data collected by said receiving coil 16.

According to an embodiment these units are all contained wholly or at least partly inside the case of the magnetic unit, and/or wholly or at least partly in a closable compartment of the structure of the patient table. According to a further embodiment these units may be all or at least partly formed by a traditional PC running a program in which instructions are coded for controlling the PC processor or processors in order to carry out the functions of the said part of units.

According to an embodiment, the supervision, pre-processing and reconstruction unit 130, the control and data capture unit 230, the thermal and magnetic control unit 110 and the receiver unit 150 communicate with one another and/or with other units by means of a bus 7.

More particularly, these units communicate with the CPU 18 of a conventional personal computer, having conventional peripherals, according to the desired or required quantity and type. The display and command entry peripherals denoted with numerals 118, 218, 318, as well as a mass memory for filing and a memory for the specific image processing and display software, collectively denoted with numeral 418 are connected to the CPU 18.

According to another embodiment, the CPU 18 may also communicate 107' in turn with a local communication network 7', such as a LAN network within the hospital or an Intranet or Internet network, or a network of any other suitable type. The communication bus 7 is also connected with a modem unit 19, which allows connection to a local network and/or to other machines connected to the local network via a telephone line. This redundancy, besides allowing to communicate with local networks in other locations, is also an alternative method for connection with the local LAN network, in case of temporary communications problems of the network interfaces.

As is apparent from the above description, the communication bus is not only provided between the individual units, but is also extended inside the latter, thereby providing the greatest configuration and operation freedom as well as allowing to add functional units with new functions and/or to replace old type units with more modern units. Replacement operations, both for upgrading and repairing purposes are apparently easy. As long as signals are encoded consistently with the bus in use, any unit may be connected to the communication bus 7 and is able to exchange data and commands with the other units.

The above disclosed exemplary construction of the apparatus allows additional configurations, which might be highly advantageous in terms both of cost effectiveness and of organization and management. In fact, the connection of various units through a conventional data bus allows to control several apparatuses, even of different types, but all having the same configuration as the processing and control electronics, from a single location or from a limited number of locations.

According to a further embodiment, a system may be also provided which comprises several machines organized in groups, each having a single dedicated console in the form of a conventional computer, each conventional computer associated to each group being configured as a client computer, which accesses a server computer via a network. In this case, the server computer may contain many different programs for controlling image acquisition and/or processing and reconstruction procedures, e.g. a database of Nuclear Magnetic Resonance imaging sequences, a database of signal filtering and/or processing procedures aimed at modulating the definition and/or the contrast and/or the signal-to-noise ratio and/or the imaging times, whereas the client computers may access the server databases to extract programs and/or image acquisition and/or processing procedures from said databases.

By this arrangement, client computers may be configured in a more inexpensive manner, especially as regards memories and graphic sections. Also, limited-quality means, e.g., monitors or printers, may be provided locally, while higher-quality means are associated to the server. This provides considerable resource savings, and allows, for instance to purchase higher-quality monitors and/or other display means, such as printers or the like.

Figure 8:
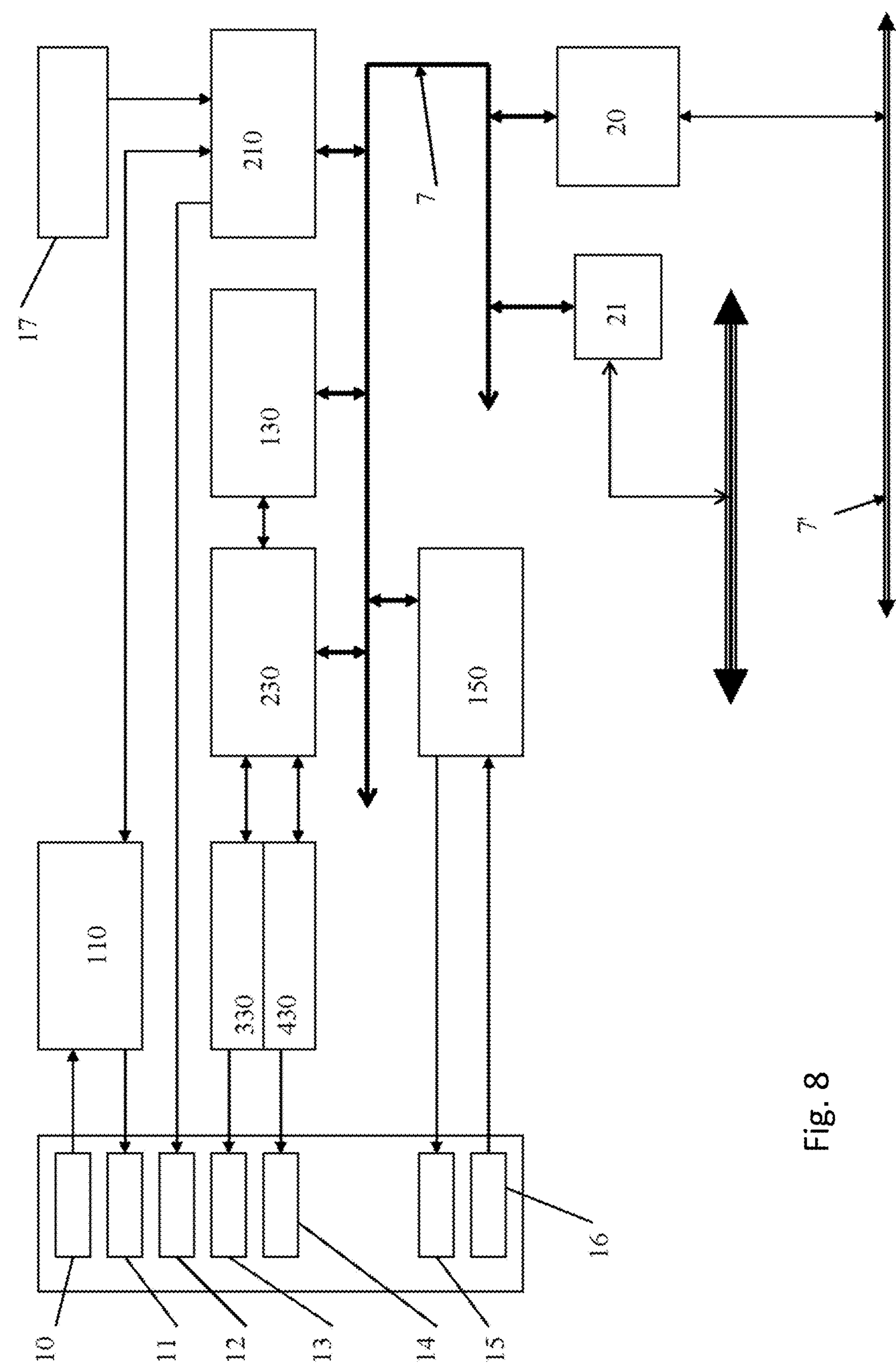
FIG. 8 is a block diagram of a variant exemplary embodiment of an MRI apparatus.

A further configuration example of an MRI system according to the invention, fit for this configuration, is shown in FIG. 8. Same functions or means in this figure are denoted with same numerals. As is evident from the comparison with FIG. 2, the units that are expressly dedicated to the control of the magnetic unit and to the reception of echo signals, as well as to signal processing to extract image data are identical to those described with reference to FIG. 6. However, unlike the previous example of FIG. 6, the apparatus has no dedicated console, but includes a local CPU unit which controls the communications between the internal bus 7 and the communication bus, e.g., a LAN network or the like, denoted with numeral 20. A modem 21 may be provided to allow communication via telephone lines. The local CPU 20, where to local memories may be associated, accesses a local computer via the LAN network, which local computer integrates the units as described in FIG. 6 and is designed to control several machines. As mentioned above, the local computer may in turn be a client computer of a server computer for generally controlling several groups of apparatuses. The presence of an internal controlling CPU 20 does not cause a real cost increase, both due to the comparatively little cost of CPUs and to the fact that this configuration allows to reduce the number of computers dedicated to the control of machines.

Moreover, according to a further embodiment, the local CPU may be used to also control local peripherals, such as storage, display, print and control entry means.

It shall be noted that the presence of a local CPU 20 does not even hinder the possibly desired provision of one or more machines having a dedicated console.

FIG. 9 is a block diagram of a system for determining the distribution of correction elements of the magnetic field executing one or more algorithm provided by the one or more embodiments disclosed in relation of the method for correcting inhomogeneity of the static magnetic field particularly of the static magnetic field generated by the magnetic structure of a machine for acquiring nuclear magnetic resonance images and MRI system for carrying out such method.

In the embodiment of FIG. 9 the system for automatically determining by means of a machine learning algorithm as disclosed above in the different embodiments is configured also for automatically executing the pick and place of the correction elements determined according to the distribution computed by the algorithm and also for automatically measuring at predetermined space position the strength of the magnetic field generated by the MRI magnet in a volume.

Numeral 900 indicates a magnet and 901 a volume permeated by the magnetic field generated by the magnet and according to the above disclosed method the said volume is delimited by a closed three-dimensional boundary surface S1 having spherical or spheroidal shape as indicated by S1 in FIG. 2. An automatic magnetic field measuring unit consisting in a robotic arm 902 carrying o its end effector a probe 903 is shown and the measured data is fed to a input interface 904. The positional data of the end effector tip on the surface S1 and particularly on a grid spanned along the said surface and the corresponding measured field strength at the said points defined by the gird are saved as a triplet data in a database. The displacement of the end effector tip carrying the magnetic field sensor 903 is carried out by a robotic arm control unit 916.

According to an embodiment the robotic arm control unit generates control signals of the robotic arm as a function of input data consisting in a digital model of the boundary surface S1 and of the crossing points of a model of the three-dimensional grid extending along the said boundary surface S1.

The said digital model of the three-dimensional closed boundary surface S1 and of the grid provided along the said surface is saved in a memory 918 which is controlled by a processing unit 911.

According to an embodiment in the said memory 918 there may be saved also the digital model of the second three-dimensional closed boundary surface S2, i.e., the boundary surface enclosing the herein defined image field of view and the grid for evaluating the magnetic field in the volume inside the said second boundary surface.

The data relating to the measured magnetic field along the three-dimensional grid and of the coordinates of the crossing points of the said grid at which the field is measured are i.e. the measurement point are stored in a memory 905.

The above disclosed embodiment using a robotic arm for carrying out the measurement of the magnetic field on the three-dimensional grid has to be considered only an example. Many different devices may be used for carrying out the said measurement which may be fully manual or at least partially automatic and partially manual.

In a manual embodiment, a sensor support structure, allowing the displacement in a three-dimensional space of a sensor is provided. The position of the sensor on the grid may be determined by a numerical table which defines the position of the crossing point in the said three-dimensional grid using a reference coordinate system. In a variant embodiment, the reference coordinate system may be a cartesian one and the sensor is mounted on a combination of three slides mounted one slide on the other and displaceable relatively to the other in one of the three directions of the cartesian coordinate system. The slides may be combined each one with a position measuring device of the said slide along the corresponding direction of displacement and the said measuring device is used to control the position of each slide according to the coordinates of each of the crossing points of the grid at which the field has to be measured. Position data and corresponding field strength data are then inputted in the memory 905. This can be executed fully manually or in an automatic way if the slide position measuring devices are position measuring sensors generating a position related signal and if the field sensor also generates a field strength related signal. As further variants other sensor supporting structures may be provided which are configured for being harmonized with for example other coordinate systems for determining the position of the crossing points of the grid.

A memory 920 is provided in which a processing algorithm 920 is saved which can be recalled by the central processing unit 911 and executed. A further memory are provided and addressable by the processing algorithm software executed by the processing unit 911 which in the present exemplary embodiment are indicated respectively with 908 for saving a database of historical distributions of correction elements, 913 for the settings relatively to the constraints, 909 settings relative to the homogeneity parameters to be used in executing the algorithm 920, the corresponding setting parameters being provided by the user through an input and output user interface 915. Further to the optimization algorithm 920 memories 910 and 912 may be provided for saving the software coding the instructions for the processing unit for carrying out respectively the generation of the starting distribution of correction elements, i.e., the dipoles and a magnetic field evaluation in the volume enclosed by the second boundary surface S2 according to the one or more embodiments or variants of the above disclosed method.

According to the embodiment of FIG. 9, a further robotic arm may be provided indicated by 906 which carry at it end effector a grasping device for picking up one correction element from a correction elements magazine 907 and place the said correction elements at the calculated position on a pole plate 201, 202 of the magnetic structure 900, for example according to one of the embodiments of FIG. 1 or 2, which has been determined by the computed distribution of correction elements.

A memory is provided in which the Database of known cases 919 is provided in which a digital model of the geometry of the magnetic structure 900 and of the pole plates is saved. Which model is used to determine by the processing unit 911 the control signals to be fed to the said robotic arm 906 by the robotic arm control unit 916 the said control signals being generated as a function of the said digital model and of the position coordinates of the correction elements, i.e. the dipoles calculated by carrying out the optimization algorithm 920.

In parallel of in sequence, this meaning before effectively carrying out the placement of the correction elements on the pole plates or even after the said placement, the output data relatively to the position of the said correction elements on the dipoles and also relatively to their magnetic charge may be used in combination with the digital model of the magnetic structure and of the pole plates saved in memory 919 to construct a digital image representing the pole plates with placed on it the distribution of correction elements and which representation may be displayed to the user by means of the Input and output user interface comprising also a display.

With the term input and output user interface different kinds of input and output tools and devices are addressed which are known from the state of the art, as for example point and click devices, touchpads, displays, touch screens, digital spectacles, vocal interfaces and other well-known tools and devices.

Relating to the hardware system forming the processing unit and the disclosed peripherals, this can be any kind of computing device, such a workstation, a PC with one or more CPU and/or GPU.

The processing unit 911 and the disclosed peripherals may be also at least partly formed by the hardware already provided in a system such as for example the MRI apparatus according to the embodiments of FIGS. 6 to 8.

In this case the software coding the instructions for carrying out the steps 300 to 350 and for generating the input/output interface windows for the user can also be in the form of software stably saved in an internal memory of the processing unit such as an hard disk or a SSD or a RAM or ROM memory or is can be saved on a portable memory unit such as a pen drive, an externa disk drive, a CD-ROM a CD-RAM a DVD-ROM, a DVD-RAM or other portable memory having different hardware structure and operating according to different protocols, the processing unit 911 being provided with reader for one or more of the above listed examples of portable memory supports.

The invention claimed is:

1. A method for shimming a magnetic field which is generated by a magnetic structure comprising a plurality of poles, and which permeates a volume of space, the method comprising:

a) defining a shimming field of view comprising a part of a volume of space enclosed by a three-dimensional closed surface permeated by the magnetic field;

b) measuring at least a feature of the magnetic field in a plurality of locations of a three-dimensional grid, along the three dimensional closed surface;

c) defining a positioning surface on each pole of the magnetic structure for positioning one or more correction elements of the magnetic field, depending on the magnet structure;

d) calculating position and magnitude parameters of said one or more correction elements to obtain predetermined target values of the magnetic field characteristics;

in which e) target values of the magnetic field characteristics are a magnetic field homogeneity;

f) the measured feature of the magnetic field is the field homogeneity on the three-dimensional grid;

g) the correction elements being magnetic dipoles; and h) a distribution of the position and magnitude parameters of said one or more correction elements on the poles of the magnetic structure being chosen to minimize homogeneity variations of a shimmed magnetic field resulting from an addition of the magnetic field generated by the magnetic structure and a magnetic field generated by the correction elements on the poles of the magnetic structure; and optionally starting from the magnetic field generated by the magnetic structure with any correction elements already positioned on a pole and iteratively repeating step d) as additional correction elements are added until a predetermined target value is met;

wherein evaluation parameters of the magnetic field homogeneity are a statistical standard deviation of the magnetic field strength inside the volume of space and minimizing homogeneity variations is done by minimizing a standard deviation of the sum of magnetic fields in the volume;

further comprising the steps of:

defining a second three-dimensional closed boundary surface enclosing a part of the volume of space permeated by the magnetic field, the second three-dimensional surface having a different shape than the first three-dimensional closed boundary surface and the volume of space enclosed by the two boundary surfaces being at least partly coincident with each other;

the second three-dimensional closed boundary surface enclosing a part of the volume of space permeated by the magnetic field coinciding with the part of a target body which is represented and visible in an image of the target body;

numerically evaluating the magnetic field in the part of the volume of space inside the second three-dimensional closed boundary surface by applying a field expansion equation; and calculating from the numerical evaluation of the magnetic field the homogeneity variations of the magnetic field for each iteration of the step d).

2. The method according to claim 1, in which the positioning surface of the correction elements is defined by continuous values of position coordinates.

3. The method according to claim 1, in which a spherical or spheroidal surface is provided as a first three-dimensional closed boundary surface and a cubic surface is provided as a second three-dimensional closed boundary surface, while the expansion function for calculating the magnetic field in the volume inside the second cubic boundary surface is a spherical or spheroidal harmonic function of the kind:

$$B(\vartheta, \varphi) = B_0 + \sum_{l,m} P_{l,m}(\cos\vartheta)(a_{l,m}\cos\vartheta + b_{l,m}\sin\vartheta)$$

in which $B(\vartheta, \varphi)$ is the magnetic field depending on spherical coordinates $\vartheta$ and $\varphi$; and l, m are indexes of the order and degree of the harmonic functions $P_{l,m}$, and of the coefficients $a_{l,m}$ and $b_{l,m}$.

4. The method according to claim 3, in which maximum values of the index I and of the index m are determined by:

estimating an order of magnitude of error in experimentally measuring the magnetic field in the volume inside the second cubic boundary surface;

and ending the expansion for indexes I and m for which the numerical error is of the same order of magnitude of the error in experimentally measuring the magnetic field.

5. The method according to claim 1, in which the step d) is carried out by providing a starting distribution of correction elements, the starting distribution of correction elements comprising a predetermined number N of correction elements for each pole;

and the position or the magnetic charge of each correction element is determined according to one of the listed ways or by any combination or sub-combination thereof:

i) generation of a predetermined number of different distributions of calculated correction elements of the magnetic field resulting from the adding of the magnetic field generated by the magnetic structure to the magnetic field generated by each different distribution, calculation of a standard deviation for the magnetic field resulting from each different distribution of correction elements and selection as the starting distribution for carrying out step d) or step d) to h) of the distribution of corresponding correction elements leading to the lowest standard deviation;

ii) generation of a population of a predetermined number of randomly generated distributions of correction elements and processing the population by an evolutionary genetic algorithm, selecting as the starting distribution of correction elements for carrying out the step d) or the steps d) to h) the distribution of correction elements generated by the evolutionary genetic algorithm having the lowest standard deviation of the magnetic field;

iii) using a distribution of correction elements which is used and known from one or more magnetic structures which has been subjected to a shimming process in earlier times and which has been saved in a database either directly as a starting distribution or as the predetermined number of populations for applying the evolutionary algorithm.

6. The method according to claim 1, in which a specific cost function to be minimized by a nonlinear programming solver algorithm is the following:

$$\min_x f(x) \text{ such that } \begin{cases} c(x) \le 0 \\ ceq(x) = 0 \\ A \cdot x \le b \\ Aeq \cdot x = beq \\ lb \le x \le ub, \end{cases}$$

in which x is the distribution of the position and magnitude parameters of said one or more correction elements represented by a N×3 matrix in which N is the number of magnetic dipoles, the number 3 is for the following parameters: the X, Z coordinates defining a two dimensional surface of the poles and q is the magnetic charge of each dipole;

c(x) and ceq(x) are functions defining respectively geometric and magnetic constraints to be respected by each distribution x;

lb, ub represents the lower bounds (lb) and upper bounds (ub) for a distribution x relating to the maximum allowed X coordinate, the maximum allowed Z coordinate on the corresponding pole plate and the max allowed magnetic charge of each dipole;

A and Aeq are matrices and b, beq and ceq are vectors in which specific correlation conditions between various dipoles of the distribution x are set and optionally the minimization algorithm may be reduced to the following algorithm:

$$\min_x f(x) \text{ such that } \begin{cases} c(x) \le 0 \\ lb \le x \le ub \end{cases}$$

by describing the geometrical and magnetic constraints and correlations between dipoles N of the same distribution in the functions c(x) and ceq(x) only.

7. A system for carrying out shimming of magnetic structures for generating a static magnetic field in an MRI apparatus, the system comprising:

a sensor for measuring the magnetic field;

a structure for supporting the sensor, which structure can be displaced at least along three spatial coordinates for positioning the sensor at different spatial positions, the supporting structure having a predetermined position relatively to the magnetic structure;

the supporting structure comprising driving units for displacing the structure along respectively each of the three spatial coordinates and position measuring sensors of the supporting structure along each of the coordinates;

a data collection unit receiving magnetic field measures of the sensor at each spatial position and comprising a memory for saving the data pairs relating to magnetic field strength and spatial position at which the magnetic field strength has been measured;

a processing unit comprising a memory in which at least one model of a three-dimensional grid along a first three-dimensional closed boundary surface provided within a volume of space permeated by a magnetic field, and optionally at least one model of a second three-dimensional closed boundary surface provided within a volume of space permeated by a magnetic field, the coordinate system of the models being registered one with the other and with the coordinate system of the magnetic field;

the processing unit being configured by executing the instructions of a magnetic field measuring program to position the sensor for measuring the magnetic field at each of the positions of the grid along the closed boundary surface by controlling the driving units for displacing the supporting structure as a function of the model of the three-dimensional grid and to register the field at each of the points of the grid and the coordinates of the points;

a processing unit executing a program comprising the instructions for calculating the magnetic field strength in the space inside the second three-dimensional boundary surface and for calculating the magnetic field variations inside the space;

another processing unit executing a program comprising the instructions for carrying out the steps of the method according to claim 1;

the magnetic structure comprising at least two magnetic poles generating the magnetic field, the two magnetic poles comprising a surface interfacing a volume of space permeated by the magnetic field and the surface being formed by a pole having a predetermined length and width and being configured to receive a set of magnetic dipoles at different positions on the surface each dipole having a magnetic charge;

a user interface comprising input units and output units, the output units comprising at least a display in which representation of the pole plates of the magnetic poles of the magnetic structure are shown and the representation of each of the magnetic dipoles placed on the poles at their position on the pole and optionally with the corresponding indication of the magnetic charge are shown; and the input units of the user interface comprising at least input devices for entering data and or commands.

8. The system according to claim 7, in which an automatic pick and place device for the positioning of the correction elements is provided, which is provided in combination with a magazine of differently magnetically charged correction elements and a control unit of a robotic arm which controls the pick and place operations of the correction elements on the positioning grid according to the compute distribution and which control unit receives the coordinates of the position of each correction element and the information of which kind of correction element is to be put in place at a certain coordinate on the grid from the processing unit and generates the commands to drive the robotic arm.

9. The system according to claim 8, wherein the pick and place device is a robotic arm.

10. An MRI apparatus comprising a magnetic structure generating a magnetic field permeating the space of a gantry of the MRI apparatus and further comprising a system according to claim 7.

11. The MRI apparatus according to claim 10, wherein the MRI apparatus is provided with a processing unit for executing instructions coded in programs, which processing unit can be the same processing unit controlling the operations of the MRI apparatus or an additional processing unit dedicated to the shimming operations, the programs coding the instructions being saved in a memory on board of the MRI apparatus.

12. The MRI apparatus according to claim 7 in which the coordinates of the position of the magnetic dipoles on the surface of the poles being configured to receive a set of magnetic dipoles at different positions are continuous.

13. An MRI apparatus, comprising a magnetic structure generating a magnetic field permeating the space of a gantry of the MRI apparatus and further comprising a system for carrying out shimming of magnetic structures for generating a static magnetic field in an MRI apparatus, the system comprising:

a sensor for measuring the magnetic field;

a structure for supporting the sensor, which structure can be displaced at least along three spatial coordinates for positioning the sensor at different spatial positions, the supporting structure having a predetermined position relatively to the magnetic structure;

the supporting structure comprising driving units for displacing the structure along respectively each of the three spatial coordinates and position measuring sensors of the supporting structure along each of the coordinates;

a data collection unit receiving magnetic field measures of the sensor at each spatial position and comprising a memory for saving the data pairs relating to magnetic field strength and spatial position at which the magnetic field strength has been measured;

a processing unit comprising a memory in which at least one model of a three-dimensional grid along a first three-dimensional closed boundary surface provided within a volume of space permeated by a magnetic field, and optionally at least one model of a second three-dimensional closed boundary surface provided within a volume of space permeated by a magnetic field, the coordinate system of the models being registered one with the other and with the coordinate system of the magnetic field;

the processing unit being configured by executing the instructions of a magnetic field measuring program to position the sensor for measuring the magnetic field at each of the positions of the grid along the closed boundary surface by controlling the driving units for displacing the supporting structure as a function of the model of the three-dimensional grid and to register the field at each of the points of the grid and the coordinates of the points;

a processing unit executing a program comprising the instructions for calculating the magnetic field strength in the space inside the second three-dimensional boundary surface and for calculating the magnetic field variations inside the space;

another processing unit executing a program comprising the instructions for carrying out the steps of the method according to claim 1;

the magnetic structure comprising at least two magnetic poles generating the magnetic field, the two magnetic poles comprising a surface interfacing a volume of space permeated by the magnetic field and the surface being formed by a pole having a predetermined length and width and being configured to receive a set of magnetic dipoles at different positions on the surface each dipole having a magnetic charge;

a user interface comprising input units and output units, the output units comprising at least a display in which representation of the pole of the magnetic poles of the magnetic structure are shown and the representation of each of the magnetic dipoles placed on the poles at their position on the poles and optionally with the corresponding indication of the magnetic charge are shown; and the input units of the user interface comprising at least input devices for entering data and or commands, wherein the system is configured to carry out the method of claim 1.

14. A method for shimming a magnetic field which is generated by a magnetic structure comprising a plurality of poles, and which permeates a volume of space, the method comprising:

a) defining a shimming field of view comprising a part of a volume of space enclosed by a three-dimensional closed surface permeated by the magnetic field;

b) measuring at least a feature of the magnetic field in a plurality of locations of a three-dimensional grid, along the three dimensional closed surface;

c) defining a positioning surface on each pole of the magnetic structure for positioning one or more correction elements of the magnetic field, depending on the magnet structure;

d) calculating position and magnitude parameters of said one or more correction elements to obtain predetermined target values of the magnetic field characteristics;

in which e) target values of the magnetic field characteristics are a magnetic field homogeneity;

f) the measured feature of the magnetic field is the field homogeneity on the three-dimensional grid;

g) the correction elements being magnetic dipoles; and h) a distribution of the position and magnitude parameters of said one or more correction elements on the poles of the magnetic structure being chosen to minimize homogeneity variations of a shimmed magnetic field resulting from an addition of the magnetic field generated by the magnetic structure and a magnetic field generated by the correction elements on the poles of the magnetic structure; and optionally starting from the magnetic field generated by the magnetic structure with any correction elements already positioned on a pole and iteratively repeating step d) as additional correction elements are added until a predetermined target value is met;

in which the minimization of the statistical standard deviation of the magnetic field is calculated by respecting constraints which are geometrical or magnetic constraints which are of the following list:

minimal distance between positions of adjacent dipoles on the corresponding pole or between the position of a dipole and already present magnetic charges on the corresponding pole;

a maximum allowed magnetic charge of each dipole depending on its position on the corresponding magnetic poles; and the maximum magnetic charge of the dipoles varies as a function from their position on the corresponding magnetic plates;

further comprising the steps of:

defining a second three-dimensional closed boundary surface enclosing a part of the volume of space permeated by the magnetic field, the second three-dimensional surface having a different shape than the first three-dimensional closed boundary surface and the volume of space enclosed by the two boundary surfaces being at least partly coincident with each other;

the second three-dimensional closed boundary surface enclosing a part of the volume of space permeated by the magnetic field coinciding with the part of a target body which is represented and visible in an image of the target body;

numerically evaluating the magnetic field in the part of the volume of space inside the second three-dimensional closed boundary surface by applying a field expansion equation; and calculating from the numerical evaluation of the magnetic field the homogeneity variations of the magnetic field for each iteration of the step d).

15. The method according to claim 14, in which minimizing the standard deviation of the sum of magnetic fields in the volume as a function of the one or more correction elements relative to their position on the corresponding pole and to the magnetic charge of each of the correction elements while respecting the one or more constraints is carried out by a nonlinear programming solver.

16. The method according to claim 15, wherein the nonlinear programming solver is a large-scale interior-point algorithm.

17. The method according to claim 14, wherein the smaller dipoles are near the central zone of the corresponding pole and the larger dipoles are provided at the peripheral parts of the corresponding magnetic plate.

* * * * *